(12) United States Patent
Yoon et al.

(10) Patent No.: US 11,401,602 B2
(45) Date of Patent: Aug. 2, 2022

(54) CATALYST ENHANCED SEAMLESS RUTHENIUM GAP FILL

(71) Applicant: Applied Materials, Inc., Santa Clara, CA (US)

(72) Inventors: Byunghoon Yoon, Cupertino, CA (US); Seshadri Ganguli, Sunnyvale, CA (US); Xi Cen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

(21) Appl. No.: 17/140,419

(22) Filed: Jan. 4, 2021

(65) Prior Publication Data

US 2021/0214842 A1 Jul. 15, 2021

Related U.S. Application Data

(60) Provisional application No. 62/993,943, filed on Mar. 24, 2020, provisional application No. 62/959,509, filed on Jan. 10, 2020.

(51) Int. Cl.
*C23C 16/02* (2006.01)
*C23C 16/04* (2006.01)
(Continued)

(52) U.S. Cl.
CPC .............. *C23C 16/02* (2013.01); *C23C 16/04* (2013.01); *C23C 16/18* (2013.01);
(Continued)

(58) Field of Classification Search
CPC ......... C23C 16/02; C23C 16/04; C23C 16/18; C23C 16/45534; C23C 16/0272; C23C 16/45551; H01L 21/76843; H01L 21/76876; H01L 21/76879; H01L 23/53209; H01L 23/53238; H01L 23/53252; H01L 23/53266;
(Continued)

(56) References Cited

U.S. PATENT DOCUMENTS

| 5,403,620 A | 4/1995 | Kaesz et al. |
| 2007/0202678 A1 | 8/2007 | Plombon et al. |
| 2009/0242852 A1 | 10/2009 | Gatineau et al. |

FOREIGN PATENT DOCUMENTS

| EP | 1935897 A1 | 6/2008 |
| WO | 01/68948 A1 | 9/2001 |

OTHER PUBLICATIONS

PCT International Search Report and Written Opinion in PCT/US2021/012141 dated Apr. 27, 2021, 10 pages.

*Primary Examiner* — Selim U Ahmed
*Assistant Examiner* — Evan G Clinton
(74) *Attorney, Agent, or Firm* — Servilla Whitney LLC

(57) ABSTRACT

Methods of depositing a metal film with high purity are discussed. A catalyst enhanced CVD process is utilized comprising an alkyl halide catalyst soak and a precursor exposure. The precursor comprises a metal precursor having the general formula (I): $M\text{-}L_1(L_2)_y$, wherein M is a metal, $L_1$ is an aromatic ligand, $L_2$ is an aliphatic ligand, and y is a number in the range of from 2 to 8 to form a metal film on the substrate surface, wherein the $L_2$ comprises 1,5-hexdiene, 1,4-hexadiene, and less than 5% of 1,3-hexadiene. Selective deposition of a metal film with high purity on a metal surface over a dielectric surface is described.

20 Claims, 9 Drawing Sheets

(51) Int. Cl.
*C23C 16/18* (2006.01)
*C23C 16/455* (2006.01)
*H01L 21/768* (2006.01)
*H01L 23/532* (2006.01)

(52) U.S. Cl.
CPC .. *C23C 16/45534* (2013.01); *H01L 21/76843* (2013.01); *H01L 21/76876* (2013.01); *H01L 21/76879* (2013.01); *H01L 23/53209* (2013.01); *H01L 23/53238* (2013.01); *H01L 23/53252* (2013.01); *H01L 23/53266* (2013.01)

(58) Field of Classification Search
CPC ......... H01L 21/28562; H01L 21/76877; H01L 21/28556
See application file for complete search history.

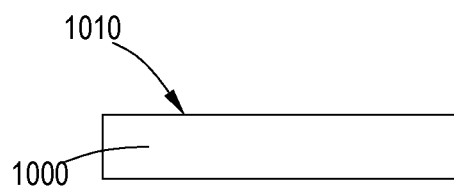
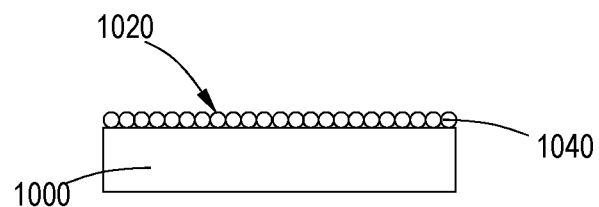
FIG. 10A  FIG. 10B
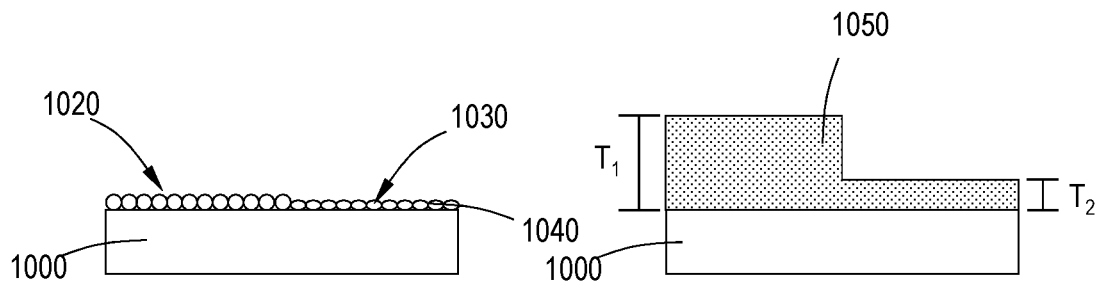
FIG. 10C  FIG. 10D

CATALYST ENHANCED SEAMLESS RUTHENIUM GAP FILL

CROSS-REFERENCE TO RELATED APPLICATIONS

This application claims priority to U.S. Provisional Application No. 62/959,509, filed Jan. 10, 2020 and to U.S. Provisional Application No. 62/993,943, filed Mar. 24, 2020, the entire disclosures of which are hereby incorporated by reference herein.

TECHNICAL FIELD

Embodiments of the disclosure generally relate to methods for depositing metal films. One or more embodiments of the disclosure are directed to methods for depositing metal films. One or more embodiments of the disclosure relate to the selective deposition of metal films.

BACKGROUND

The semiconductor industry continues to strive for continuous device miniaturization that is driven by the need for mobile and high-performance systems in emerging industries such as autonomous vehicles, virtual reality, and future mobile devices. To accomplish this feat, new, high-performance materials are needed to circumvent inherent engineering and physics issues encountered in rapid reduction of features in microelectronic devices.

Ruthenium is a proposed material for integration owing to its high melting point (ability to withstand high current densities), exceptional density, and ability to conduct electrical current. Ruthenium and ruthenium containing thin films have attractive material and conductive properties. Ruthenium films have been proposed for applications from front end to back end parts of semiconductor and microelectronic devices.

Thin-films of ruthenium would ideally be deposited using thin-film deposition techniques such as Chemical Vapor Deposition (CVD) and Atomic Layer Deposition (ALD) owing to their ability to deposit material in a high-throughput and precise fashion.

Deposited ruthenium films often differ from bulk ruthenium materials. There is particular challenges in depositing ruthenium films with high purity (>99% Ru), especially as gap fill materials. Previous solutions, including the use of oxygen reactants, produced films with greater roughness than bulk materials. Similarly, hydrogen reactants provided greater impurities which then required a subsequent annealing step. Finally, plasma deposition processes were unable to deposit gap fill materials without creating a seam and potentially damaging the underlying substrate.

Therefore there is a need for methods and materials for depositing high purity conformal ruthenium films as gap fill.

Therefore there is a need for methods and materials for depositing high purity conformal ruthenium films as gap fill. There is also a need for methods and materials for depositing ruthenium films as gap fill without seams or voids.

Additionally, as the design of semiconductor devices evolve, precision material manufacturing in the semiconductor industry has entered an era of atomic scale dimensions. At the atomic scale, with only tens of atoms at stake, there is little margin for error. This unprecedented challenge demands new material processing techniques which have atomic level precision. However, increasing the complexity of the process flow required in atomic scale device manufacturing can significantly lower throughput and increase the cost of manufacturing.

Selective deposition technologies offer the potential for chemically-selective atomic-layer precision in semiconductor film patterning. Selective deposition also offers the potential for simpler process flows by eliminating lithography or other processes.

Selective deposition of materials can be accomplished in a variety of ways. For instance, some processes may have inherent selectivity to surfaces based on their surface chemistry. These processes are fairly rare and usually need to have surfaces with drastically different surface energies, such as metals and dielectrics.

Therefore there is a need for methods of selectively depositing metal films on metallic surfaces over dielectric surfaces, or vice versa.

SUMMARY

One or more embodiments of the disclosure are directed to a method of forming a film. The method comprises forming a film on a substrate surface by exposing the substrate surface to a precursor of general formula (I): M-$L_1(L_2)_y$, wherein M is a metal, $L_1$ is an aromatic ligand, $L_2$ is an aliphatic ligand, and y is a number in the range of from 2 to 8, wherein $L_2$ comprises 1,5-hexdiene, 1,4-hexadiene, and less than 5% of 1,3-hexadiene.

Additional embodiments of the disclosure are directed to a method of forming a film. In one or more embodiments, a method comprises exposing a substrate surface to a halogen catalyst to form an activated substrate surface; and exposing the activated substrate surface to a precursor of general formula (I): M-$L_1(L_2)_y$, wherein M is a metal, $L_1$ is an aromatic ligand, $L_2$ is an aliphatic ligand, and y is a number in the range of from 2 to 8 to form a metal film on the substrate surface, wherein the $L_2$ comprises 1,5-hexdiene, 1,4-hexadiene, and less than 5% of 1,3-hexadiene.

Further embodiments are directed to a non-transitory computer readable medium including instructions, that, when executed by a controller of a processing chamber, causes the processing chamber to perform operations of: exposing a substrate surface to a halogen catalyst to form an activated substrate surface; and flowing a precursor into a processing volume of the processing chamber having the substrate, the precursor having general formula (I): M-$L_1(L_2)_y$, wherein M is a metal, $L_1$ is an aromatic ligand, $L_2$ is an aliphatic ligand, and y is a number in the range of from 2 to 8, wherein the $L_2$ comprises 1,5-hexdiene, 1,4-hexadiene, and less than 5% of 1,3-hexadiene.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 10A-10D illustrate an exemplary substrate during processing according to one or more embodiments of the disclosure.

DETAILED DESCRIPTION

Figure 1:
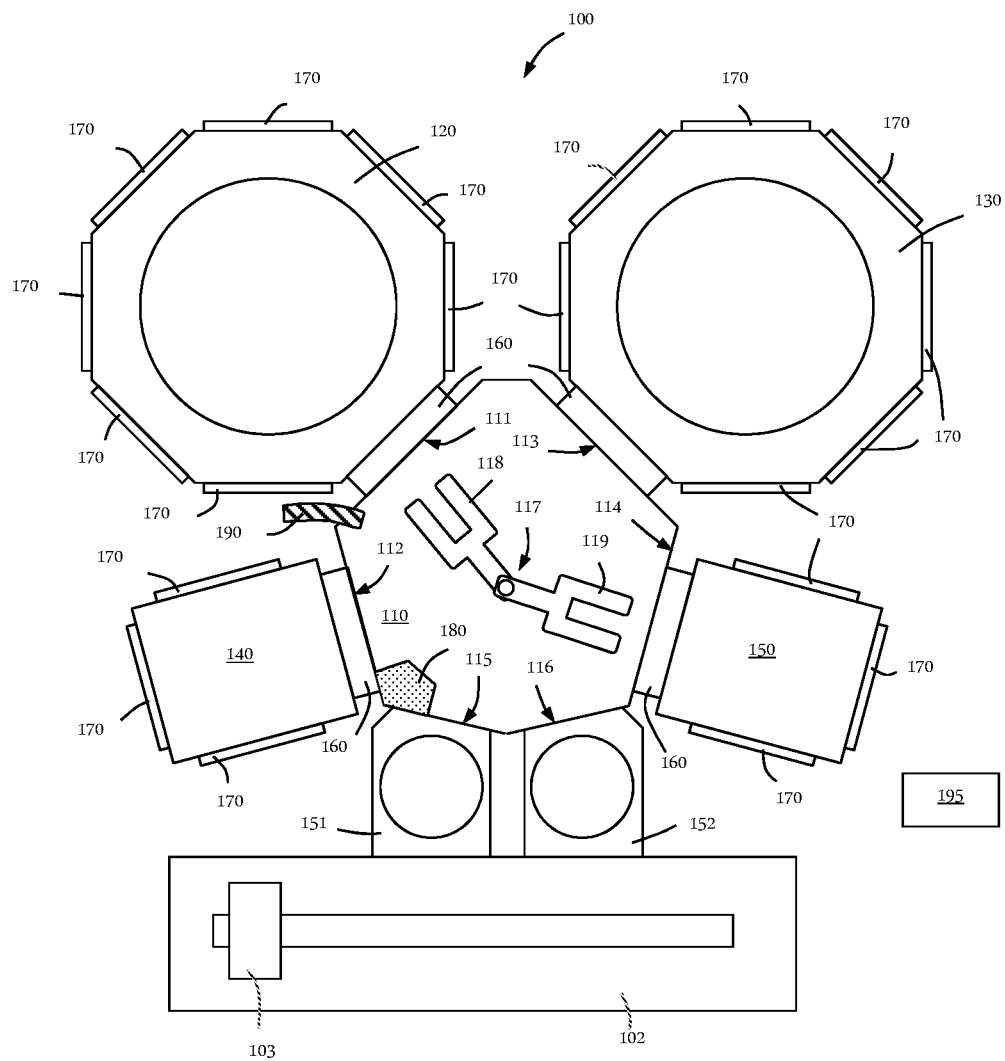
FIG. 1 illustrates a schematic view of a processing platform in accordance with one or more embodiments of the disclosure.

Before describing several exemplary embodiments of the disclosure, it is to be understood that the disclosure is not limited to the details of construction or process routines set forth in the following description. The disclosure is capable of other embodiments and of being practiced or being carried out in various ways.

As used herein, the term "substrate", "substrate surface", or the like, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., metal precursor gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction).

One or more embodiments of the disclosure are directed to processes that use a reaction chamber with multiple gas ports that can be used for introduction of different chemicals or plasma gases. Spatially, these gas ports (also referred to as channels) are separated by inert purging gases and/or vacuum pumping holes to create a gas curtain that minimizes or eliminates mixing of gases from different gas ports to avoid unwanted gas phase reactions. Wafers moving through these different spatially separated ports get sequential and multiple surface exposures to different chemical or plasma environment so that layer by layer film growth in spatial ALD mode or surface etching process occur. In one or more embodiments, the processing chamber has modular architectures on gas distribution components and each modular component has independent parameter control (e.g., RF or gas flow) to provide flexibility to control, for example, gas flow and/or RF exposure.

One or more embodiments of the disclosure provide methods for depositing a high purity metal film. The methods of various embodiments use atomic layer deposition (ALD) or chemical vapor deposition (CVD) to provide pure or nearly pure metal films. While exemplary embodiments of this disclosure refer to the deposition of ruthenium, it is conceived that the principles of this disclosure enable the deposition of highly pure metal films regardless of metal.

One or more embodiments of the disclosure provide methods of selectively depositing metal films on a metal surface over a dielectric surface. One or more embodiments of the disclosure provide methods of selectively depositing metal films on a dielectric surface over a metal surface. As used in this specification and the appended claims, the term "selectively depositing a film on one surface over another surface", and the like, means that a first amount of the film is deposited on the first surface and a second amount of film is deposited on the second surface, where the second amount of film is less than the first amount of film, or no film is deposited on the second surface.

The term "over" used in this regard does not imply a physical orientation of one surface on top of another surface, rather a relationship of the thermodynamic or kinetic properties of the chemical reaction with one surface relative to the other surface. For example, selectively depositing a ruthenium film onto a metal surface over a dielectric surface means that the ruthenium film deposits on the metal surface and less or no ruthenium film deposits on the dielectric surface; or that the formation of a ruthenium film on the metal surface is thermodynamically or kinetically favorable relative to the formation of a ruthenium film on the dielectric surface.

The selectivity of a deposition process is generally expressed as a multiple of growth rate. For example, if one surface is grown (or deposited on) 25 times faster than a different surface, the process would be described as having a selectivity of 25:1. In this regard, higher ratios indicate more selective processes.

One or more embodiments of the disclosure advantageously provide methods for depositing metal films with high purity. Accordingly, these highly pure films exhibit similar properties to their associated bulk metallic materials. For example, one or more embodiments of this disclosure provide ruthenium films which are smoother and have lower resistance than ruthenium films deposited by conventional oxygen or hydrogen reactant processes. One or more embodiments of this disclosure advantageously provide metal films which conformally fill gaps without a seam.

One or more embodiments of the disclosure advantageously provide for the selective deposition of metal films with high purity on metallic surfaces over dielectric surfaces. For example, selectively depositing ruthenium on copper over dielectrics advantageously provides copper capping layers without additional etch or lithography steps. Additionally, selective deposition may also enable bottom-up gap fill for trenches with metal contacts at the bottom and dielectric sidewalls.

One or more embodiments of the disclosure advantageously provide for the selective deposition of metal films with high purity on dielectric surfaces over metallic surfaces. For example, selectively depositing metals over dielectrics advantageously provides metal layers on barriers or other dielectrics in back end applications.

One or more embodiments of the disclosure utilize a spatial ALD process which is performed on a processing platform as disclosed herein. Referring to the Figures, FIG. 1 shows a processing platform 100 in accordance with one or more embodiments of the disclosure. The embodiment shown in FIG. 1 is merely representative of one possible configuration and should not be taken as limiting the scope of the disclosure. For example, in one or more embodiments, the processing platform 100 has different numbers of process chambers, buffer chambers, and robot configurations.

The processing platform 100 includes a central transfer station 110 which has a plurality of sides 111, 112, 113, 114, 115, 116. The central transfer station 110 shown has a first side 111, a second side 112, a third side 113, a fourth side 114, a fifth side 115 and a sixth side 116. Although six sides are shown, those skilled in the art will understand that there can be any suitable number of sides to the central transfer station 110 depending on, for example, the overall configuration of the processing platform 100.

The transfer station 110 has a robot 117 positioned therein. The robot 117 can be any suitable robot capable of moving a wafer during processing. In one or more embodiments, the robot 117 has a first arm 118 and a second arm 119. The first arm 118 and second arm 119 can be moved independently of the other arm. The first arm 118 and second arm 119 can move in the x-y plane and/or along the z-axis. In one or more embodiments, the robot 117 includes a third arm or a fourth arm (not shown). Each of the arms can move independently of other arms.

A first batch processing chamber 120 can be connected to a first side 111 of the central transfer station 110. The first batch processing chamber 120 can be configured to process x wafers at a time for a batch time. In one or more embodiments, the first batch processing chamber 120 can be configured to process in the range of about four (x=4) to about 12 (x=12) wafers at the same time. In one or more embodiments, the first batch processing chamber 120 is configured to process six (x=6) wafers at the same time. As will be understood by the skilled artisan, while the first batch processing chamber 120 can process multiple wafers between loading/unloading of an individual wafer, each wafer may be subjected to different process conditions at any given time. For example, a spatial atomic layer deposition chamber, like that shown in FIGS. 2 through 6, expose the wafers to different process conditions in different processing regions so that as a wafer is moved through each of the regions, the process is completed.

Figure 2:
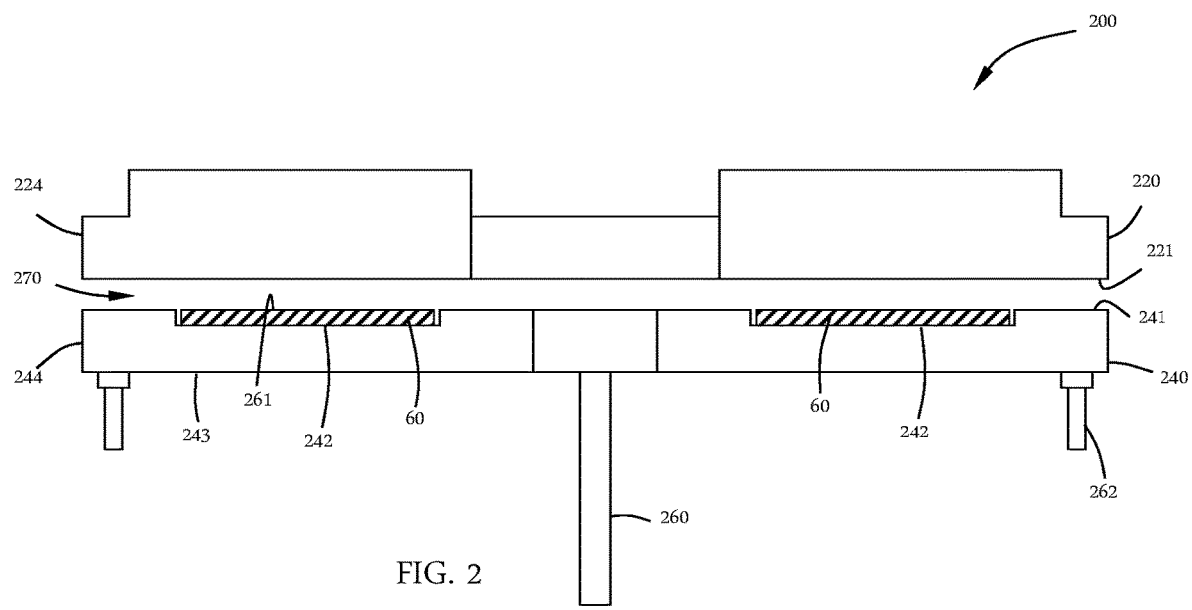
FIG. 2 illustrates a cross-sectional view of a batch processing chamber in accordance with one or more embodiments of the disclosure.

FIG. 2 shows a cross-section of a processing chamber 200 including a gas distribution assembly 220, also referred to as injectors or an injector assembly, and a susceptor assembly 240. The gas distribution assembly 220 is any type of gas delivery device used in a processing chamber. The gas distribution assembly 220 includes a front surface 221 which faces the susceptor assembly 240. The front surface 221 can have any number or variety of openings to deliver a flow of gases toward the susceptor assembly 240. The gas distribution assembly 220 also includes an outer peripheral edge 224 which in the embodiments shown, is substantially round.

The specific type of gas distribution assembly 220 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 3:
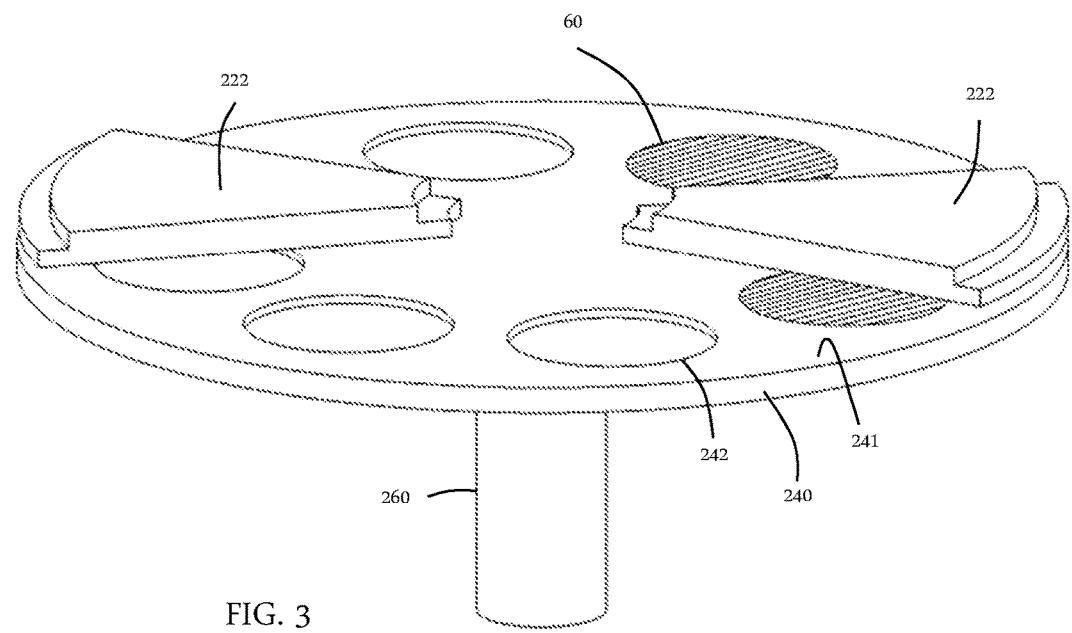
FIG. 3 illustrates a partial perspective view of a batch processing chamber in accordance with one or more embodiments of the disclosure.

In one or more embodiments, the gas distribution assembly 220 is a rigid stationary body made of a single injector unit. In one or more embodiments, the gas distribution assembly 220 is made up of a plurality of individual sectors (e.g., injector units 222), as shown in FIG. 3. Either a single piece body or a multi-sector body can be used with the various embodiments of the disclosure described.

In one or more embodiments, a susceptor assembly 240 is positioned beneath the gas distribution assembly 220. The susceptor assembly 240 includes a top surface 241 and at least one recess 242 in the top surface 241. The susceptor assembly 240 also has a bottom surface 243 and an edge 244. The at least one recess 242 can be any suitable shape and size depending on the shape and size of the substrates 60 being processed. In the embodiments shown in FIG. 2, the recess 242 has a flat bottom to support the bottom of the wafer; however, the bottom of the recess can vary. In one or more embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In one or more embodiments, as shown in FIG. 2, the recess 242 in the top surface 241 of the susceptor assembly 240 is sized so that a substrate 60 supported in the recess 242 has a top surface 61 substantially coplanar with the top surface 241 of the susceptor 240. As used in this specification and the appended claims, the term "substantially coplanar" means that the top surface of the wafer and the top surface of the susceptor assembly are coplanar within ±0.2 mm. In one or more embodiments, the top surfaces are coplanar within 0.5 mm, ±0.4 mm, ±0.35 mm, ±0.30 mm, ±0.25 mm, ±0.20 mm, ±0.15 mm, ±0.10 mm or ±0.05 mm.

The susceptor assembly 240 of FIG. 2 includes a support post 260 which is capable of lifting, lowering and rotating the susceptor assembly 240. The susceptor assembly may include a heater, or gas lines, or electrical components within the center of the support post 260. The support post 260 may be the primary means of increasing or decreasing the gap between the susceptor assembly 240 and the gas distribution assembly 220, moving the susceptor assembly 240 into proper position. The susceptor assembly 240 may also include fine tuning actuators 262 which can make micro-adjustments to susceptor assembly 240 to create a predetermined gap 270 between the susceptor assembly 240 and the gas distribution assembly 220.

In one or more embodiments, the gap 270 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 200 shown in the Figures is a carousel-type chamber in which the susceptor assembly 240 can hold a plurality of substrates 60. As shown in FIG. 3, the gas distribution assembly 220 may include a plurality of separate injector units 222, each injector unit 222 being capable of depositing a film on the wafer, as the wafer is moved beneath the injector unit. Two pie-shaped injector units 222 are shown positioned on approximately opposite sides of and above the susceptor assembly 240. This number of injector units 222 is shown for illustrative purposes only. It will be understood that more or less injector units 222 can be included. In one or more embodiments, there are a sufficient number of pie-shaped injector units 222 to form a shape conforming to the shape of the susceptor assembly 240. In one or more embodiments, each of the individual pie-shaped injector units 222 may be independently moved, removed and/or replaced without affecting any of the other injector units 222. For example, one segment may be raised to permit a robot to access the region between the susceptor assembly 240 and gas distribution assembly 220 to load/unload substrates 60.

Figure 4:
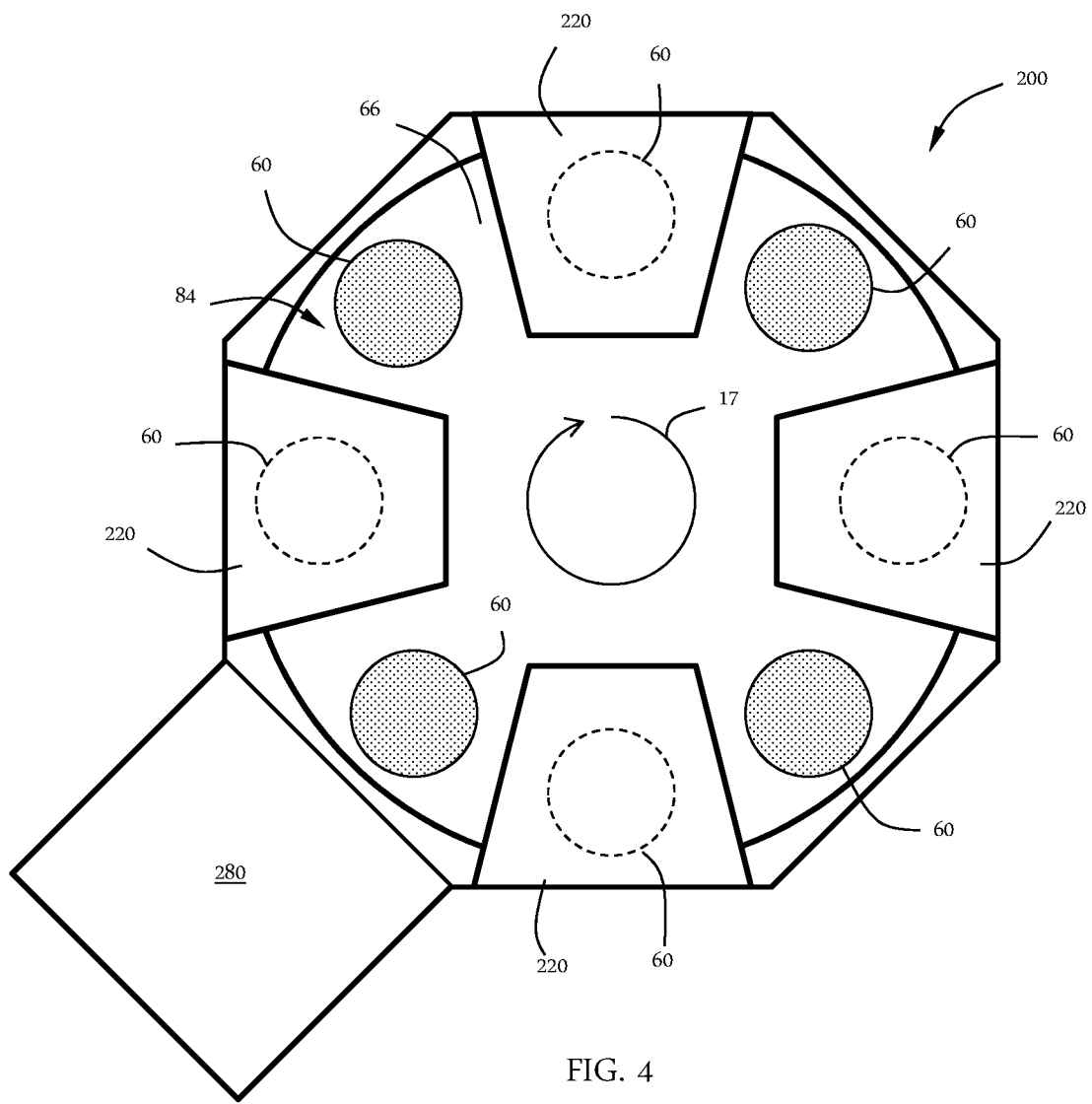
FIG. 4 illustrates a schematic view of a batch processing chamber in accordance with one or more embodiments of the disclosure.

In one or more embodiments, processing chambers having multiple gas injectors can be used to process multiple wafers simultaneously so that the wafers experience the same process flow. For example, as shown in FIG. 4, the processing chamber 200 has four gas injector assemblies and four substrates 60. At the outset of processing, the substrates 60 can be positioned between the gas distribution assemblies 220. Rotating 17 the susceptor assembly 240 by 45° will result in each substrate 60 which is between gas distribution assemblies 220 to be moved to a gas distribution assembly 220 for film deposition, as illustrated by the dotted circle under the gas distribution assemblies 220. An additional 45° rotation would move the substrates 60 away from the gas distribution assemblies 220. The number of substrates 60 and gas distribution assemblies 220 can be the same or different. In One or more embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 220 includes eight process regions separated by gas curtains and the susceptor assembly 240 can hold six wafers.

The processing chamber 200 shown in FIG. 4 is merely representative of one possible configuration and should not be taken as limiting the scope of the disclosure. Here, the processing chamber 200 includes a plurality of gas distribution assemblies 220. In the embodiments shown, there are four gas distribution assemblies 220 (also called injector assemblies) evenly spaced about the processing chamber 200. The processing chamber 200 shown is octagonal; however, those skilled in the art will understand that this is one possible shape and should not be taken as limiting the scope of the disclosure. The gas distribution assemblies 220 shown are trapezoidal, but can be a single circular component or made up of a plurality of pie-shaped segments, like that shown in FIG. 3.

The embodiment shown in FIG. 4 includes a load lock chamber 280, or an auxiliary chamber like a buffer station. This chamber 280 is connected to a side of the processing chamber 200 to allow, for example the substrates (also referred to as substrates 60) to be loaded/unloaded from the processing chamber 200. A wafer robot may be positioned in the chamber 280 to move the substrate onto the susceptor.

Rotation of the carousel (e.g., the susceptor assembly 240) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing routines between each layer deposition (e.g., exposure to plasma).

Figure 5:
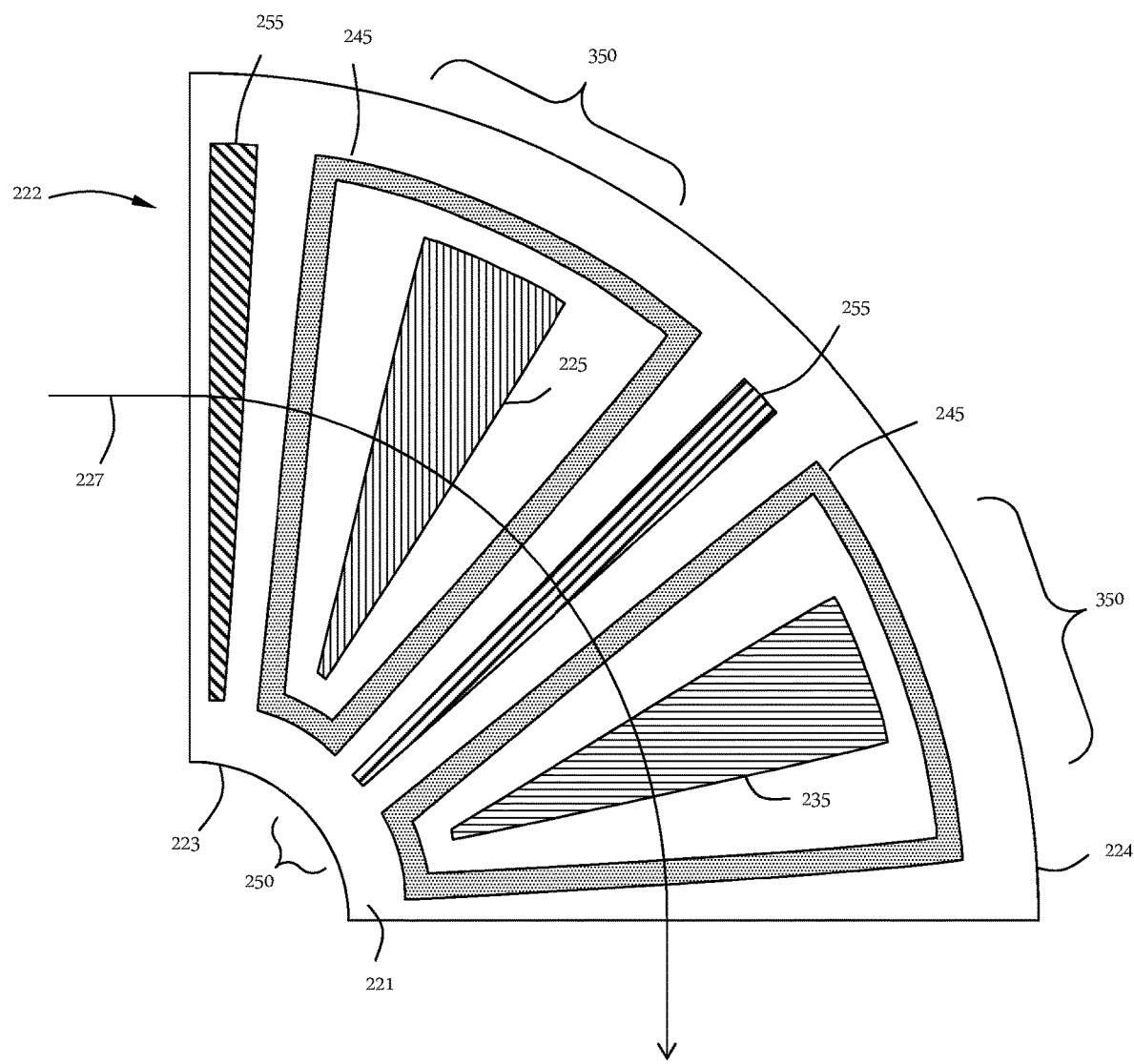
FIG. 5 illustrates a schematic view of a portion of a wedge shaped gas distribution assembly for use in a batch processing chamber in accordance with one or more embodiments of the disclosure.
Figure 6:
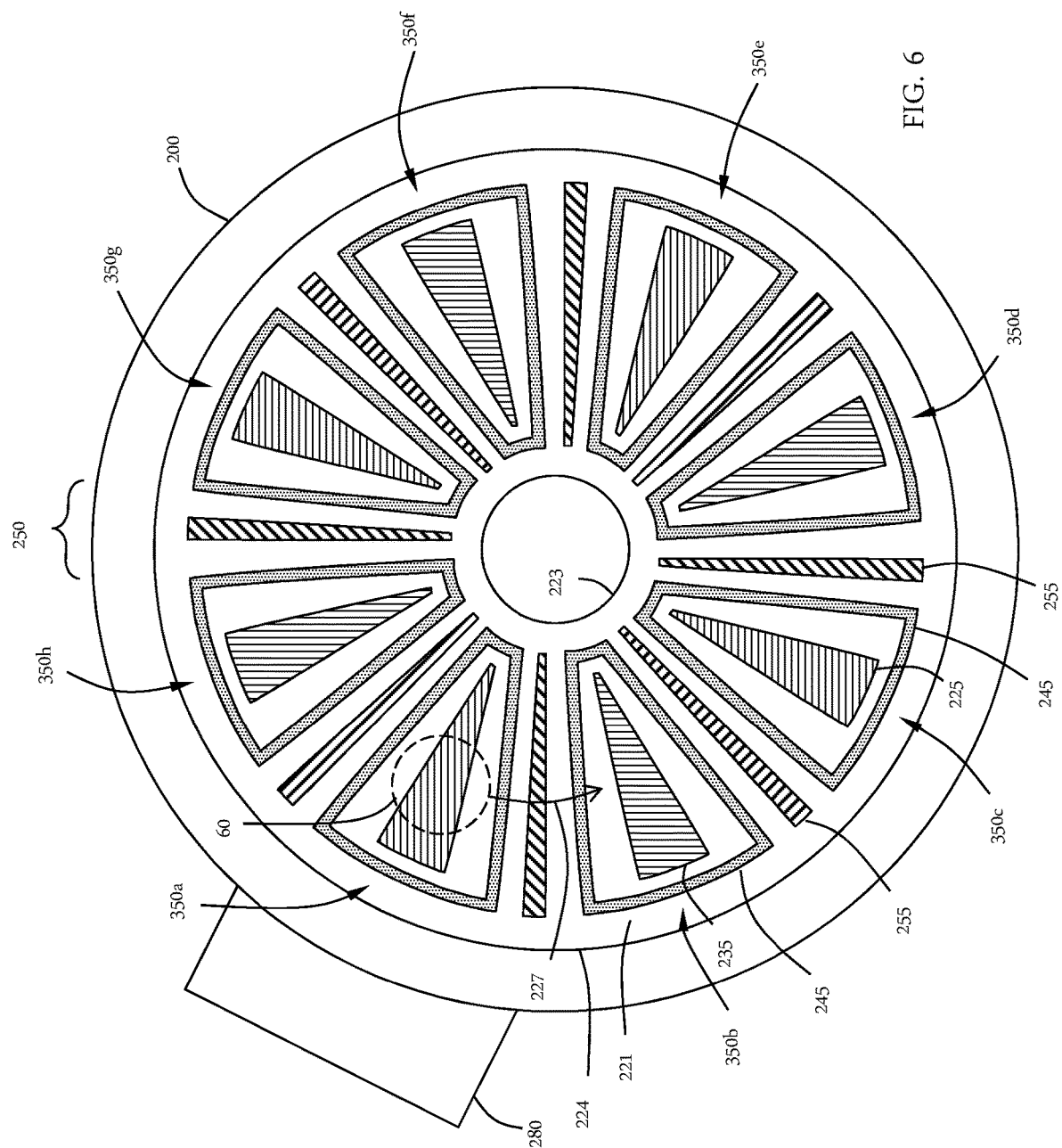
FIG. 6 illustrates a schematic view of a batch processing chamber in accordance with one or more embodiments of the disclosure.

FIG. 5 shows a sector or portion of a gas distribution assembly 220, which may be referred to as an injector unit. The injector units 222 can be used individually or in combination with other injector units. For example, as shown in FIG. 6, four of the injector units 222 of FIG. 5 are combined to form a single gas distribution assembly 220. (The lines separating the four injector units are not shown for clarity.) While the injector unit 222 of FIG. 5 has both a first reactive gas port 225 and a second gas port 235 in addition to purge gas ports 255 and vacuum ports 245, an injector unit 222 does not need all of these components.

Referring to both FIGS. 5 and 6, a gas distribution assembly 220 in accordance with one or more embodiments may comprise a plurality of sectors (or injector units 222) with each sector being identical or different. The gas distribution assembly 220 is positioned within the processing chamber and comprises a plurality of elongate gas ports 225, 235, 245 in a front surface 221 of the gas distribution assembly 220. The plurality of elongate gas ports 225, 235, 245, 255 extend from an area adjacent the inner peripheral edge 223 toward an area adjacent the outer peripheral edge 224 of the gas distribution assembly 220. The plurality of gas ports shown include a first reactive gas port 225, a second gas port 235, a vacuum port 245 which surrounds each of the first reactive gas ports and the second reactive gas ports and a purge gas port 255.

With reference to the embodiments shown in FIG. 5 or 6, when stating that the ports extend from at least about an inner peripheral region to at least about an outer peripheral region, however, the ports can extend more than just radially from inner to outer regions. The ports can extend tangentially as vacuum port 245 surrounds reactive gas port 225 and reactive gas port 235. In the embodiments shown in FIGS. 5 and 6, the wedge shaped reactive gas ports 225, 235 are surrounded on all edges, including adjacent the inner peripheral region and outer peripheral region, by a vacuum port 245.

Referring to FIG. 5, as a substrate moves along path 227, each portion of the substrate surface is exposed to the various reactive gases. To follow the path 227, the substrate will be exposed to, or "see", a purge gas port 255, a vacuum port 245, a first reactive gas port 225, a vacuum port 245, a purge gas port 255, a vacuum port 245, a second gas port 235 and a vacuum port 245. Thus, at the end of the path 227 shown in FIG. 5, the substrate has been exposed to the first reactive gas and the second reactive gas to form a layer. The injector unit 222 shown makes a quarter circle but could be larger or smaller. The gas distribution assembly 220 shown in FIG. 6 can be considered a combination of four of the injector units 222 of FIG. 3 connected in series.

The injector unit 222 of FIG. 5 shows a gas curtain 250 that separates the reactive gases. The term "gas curtain" is used to describe any combination of gas flows or vacuum that separate reactive gases from mixing. The gas curtain 250 shown in FIG. 5 comprises the portion of the vacuum port 245 next to the first reactive gas port 225, the purge gas port 255 in the middle and a portion of the vacuum port 245 next to the second gas port 235. This combination of gas flow and vacuum can be used to prevent or minimize gas phase reactions of the first reactive gas and the second reactive gas.

Referring to FIG. 6, the combination of gas flows and vacuum from the gas distribution assembly 220 form a separation into a plurality of process regions 350. The process regions are roughly defined around the individual gas ports 225, 235 with the gas curtain 250 between 350. The embodiments shown in FIG. 6 makes up eight separate process regions 350 with eight separate gas curtains 250 between. A processing chamber can have at least two process regions. In One or more embodiments, there are at least three, four, five, six, seven, eight, nine, 10, 11 or 12 process regions.

During processing a substrate may be exposed to more than one process region 350 at any given time. However, the portions that are exposed to the different process regions will have a gas curtain separating the two. For example, if the leading edge of a substrate enters a process region including the second gas port 235, a middle portion of the substrate will be under a gas curtain 250 and the trailing edge of the substrate will be in a process region including the first reactive gas port 225.

A factory interface (as shown in FIG. 4), which can be, for example, a load lock chamber 280, is shown connected to the processing chamber 200. A substrate 60 is shown superimposed over the gas distribution assembly 220 to provide a frame of reference. The substrate 60 may often sit on a susceptor assembly to be held near the front surface 221 of the gas distribution assembly 220. The substrate 60 is loaded via the factory interface into the processing chamber 200 onto a substrate support or susceptor assembly (see FIG. 4). The substrate 60 can be shown positioned within a process region because the substrate is located adjacent the first reactive gas port 225 and between two gas curtains 250a, 250b. Rotating the substrate 60 along path 227 will move the substrate counter-clockwise around the processing chamber 200. Thus, the substrate 60 will be exposed to the first process region 350a through the eighth process region 350h, including all process regions between.

One or more embodiments of the disclosure are directed to a processing chamber 200 with a plurality of process regions 350a-350h with each process region separated from an adjacent region by a gas curtain 250. For example, the processing chamber shown in FIG. 6. The number of gas curtains and process regions within the processing chamber can be any suitable number depending on the arrangement of gas flows. The embodiment shown in FIG. 6 has eight gas curtains 250 and eight process regions 350a-350h.

Referring back to FIG. 1, the processing platform 100 includes a treatment chamber 140 connected to a second side 112 of the central transfer station 110. The treatment chamber 140 of one or more embodiments is configured to expose the wafers to a process to treat the wafers before and/or after processing in first batch processing chamber 120. The treatment chamber 140 of one or more embodiments comprises an annealing chamber. The annealing chamber can be a furnace annealing chamber or a rapid thermal annealing chamber, or a different chamber configured to hold a wafer at a predetermined temperature and pressure and provide a flow of gas to the chamber.

In one or more embodiments, the processing platform further comprises a second batch processing chamber 130 connected to a third side 113 of the central transfer station 110. The second batch processing chamber 130 can be configured similarly to the first batch processing chamber 120, or can be configured to perform a different process or to process different numbers of substrates.

The second batch processing chamber 130 can be the same as the first batch processing chamber 120 or different. In one or more embodiments, the first batch processing chamber 120 and the second batch processing chamber 130 are configured to perform the same process with the same number of wafers in the same batch time so that x (the number of wafers in the first batch processing chamber 120) and y (the number of wafers in the second batch processing chamber 130) are the same and the first batch time and second batch time (of the second batch processing chamber 130) are the same. In one or more embodiments, the first batch processing chamber 120 and the second batch processing chamber 130 are configured to have one or more of different numbers of wafers (x not equal to y), different batch times, or both.

In the embodiments shown in FIG. 1, the processing platform 100 includes a second treatment chamber 150 connected to a fourth side 114 of the central transfer station 110. The second treatment chamber 150 can be the same as the treatment chamber 140 or different.

The processing platform 100 can include a controller 195 connected to the robot 117 (the connection is not shown). The controller 195 can be configured to move wafers between the treatment chamber 140 and the first batch processing chamber 120 with a first arm 118 of the robot 117. In one or more embodiments, the controller 195 is also configured to move wafers between the second treatment chamber 150 and the second batch processing chamber 130 with a second arm 119 of the robot 117.

In one or more embodiments, the controller 195 is connected to the susceptor assembly 240 and the gas distribution assembly 220 of a processing chamber 200. The controller 195 can be configured to rotate the susceptor assembly 240 about a central axis. The controller can also be configured to control the gas flows in the gas ports 225, 235, 245, 255. In one or more embodiments, the first reactive gas port 225 provides a flow of a metal precursor. In one or more embodiments, the second reactive gas port 235 provides a flow of a reactant. In one or more embodiments, other gas ports (not labeled) may provide a flow of plasma. The first reactive gas port 225, the second reactive gas port 235 and the other reactive gas ports (not labeled) may be arranged in any processing order.

The processing platform 100 can also include a first buffer station 151 connected to a fifth side 115 of the central transfer station 110 and/or a second buffer station 152 connected to a sixth side 116 of the central transfer station 110. The first buffer station 151 and second buffer station 152 can perform the same or different functions. For example, the buffer stations may hold a cassette of wafers which are processed and returned to the original cassette, or the first buffer station 151 may hold unprocessed wafers which are moved to the second buffer station 152 after processing. In one or more embodiments, one or more of the buffer stations are configured to pre-treat, pre-heat or clean the wafers before and/or after processing.

In one or more embodiments, the controller 195 is configured to move wafers between the first buffer station 151 and one or more of the treatment chamber 140 and the first batch processing chamber 120 using the first arm 118 of the robot 117. In one or more embodiments, the controller 195 is configured to move wafers between the second buffer station 152 and one or more of the second treatment chamber 150 or the second batch processing chamber 130 using the second arm 119 of the robot 117.

The processing platform 100 may also include one or more slit valves 160 between the central transfer station 110 and any of the processing chambers. In the embodiments shown, there is a slit valve 160 between each of the processing chambers 120, 130, 140, 150 and the central transfer station 110. The slit valves 160 can open and close to isolate the environment within the processing chamber from the environment within the central transfer station 110. For example, if the processing chamber will generate plasma during processing, it may be helpful to close the slit valve for that processing chamber to prevent stray plasma from damaging the robot in the transfer station.

In one or more embodiments, the processing chambers are not readily removable from the central transfer station 110. To allow maintenance to be performed on any of the processing chambers, each of the processing chambers may further include a plurality of access doors 170 on sides of the processing chambers. The access doors 170 allow manual access to the processing chamber without removing the processing chamber from the central transfer station 110. In the embodiments shown, each side of each of the processing chamber, except the side connected to the transfer station, have an access door 170. The inclusion of so many access doors 170 can complicate the construction of the processing chambers employed because the hardware within the chambers would need to be configured to be accessible through the doors.

The processing platform of one or more embodiments includes a water box 180 connected to the central transfer station 110. The water box 180 can be configured to provide a coolant to any or all of the processing chambers. Although referred to as a "water" box, those skilled in the art will understand that any coolant can be used.

In one or more embodiments, the size of the processing platform 100 allows for the connection to house power through a single power connector 190. The single power connector 190 attaches to the processing platform 100 to provide power to each of the processing chambers and the central transfer station 110.

In one or more embodiments, the processing platform 100 can be connected to a factory interface 102 to allow wafers or cassettes of wafers to be loaded into the processing platform 100. A robot 103 within the factory interface 102 can be moved the wafers or cassettes into and out of the buffer stations 151, 152. The wafers or cassettes can be moved within the processing platform 100 by the robot 117 in the central transfer station 110. In one or more embodiments, the factory interface 102 is a transfer station of another cluster tool.

In one or more embodiments, the processing platform 100 or first batch processing chamber 120 is connected to a controller. The controller can be the same controller 195 or a different controller. The controller can be coupled to the susceptor assembly and the gas distribution assembly of the first batch processing chamber 120 and has one or more configurations. The configurations can include, but are not limited to, a first configuration to rotate the susceptor assembly about the central axis, a second configuration to provide a flow of a metal precursor to a process region, a third configuration to provide a flow of a reactant to a process region, a fourth configuration to provide a plasma in a process region.

One or more embodiments are directed to a non-transitory computer readable medium including instructions, that, when executed by a controller of a processing chamber, causes the processing chamber to perform operations of: exposing a substrate surface to a halogen catalyst to form an activated substrate surface; and flowing a precursor into a processing volume of the processing chamber having the substrate, the precursor having general formula (I): M-$L_1$($L_2$)$_y$, wherein M is a metal, $L_1$ is an aromatic ligand, $L_2$ is an aliphatic ligand, and y is a number in the range of from 2 to 8, wherein the $L_2$ comprises 1,5-hexdiene, 1,4-hexadiene, and less than 5% of 1,3-hexadiene.

Figure 7:
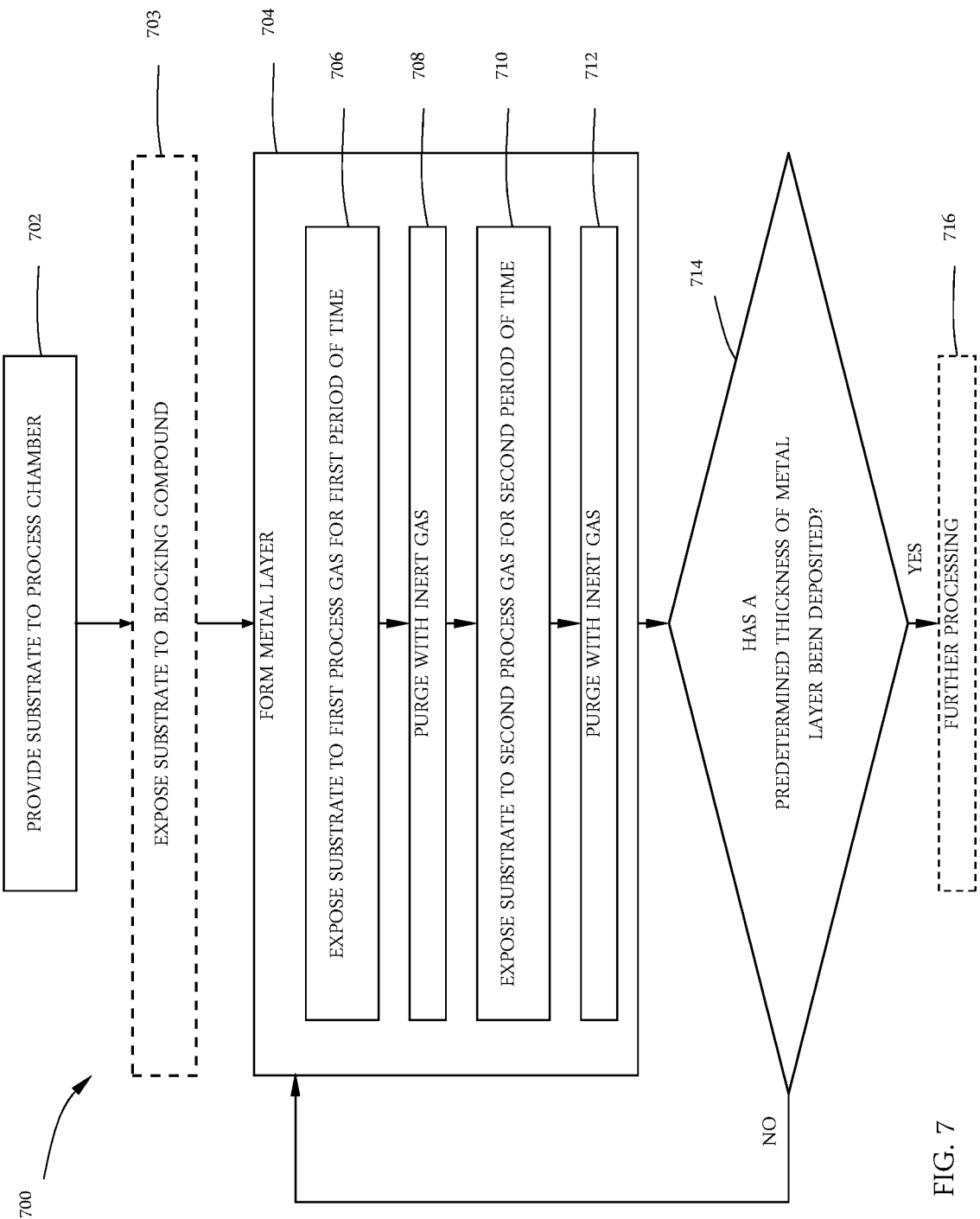
FIG. 7 illustrates a process flow diagram of a process sequence for the formation of a metal layer using a two pulse cyclical deposition technique according to one or more embodiments of the disclosure.

FIG. 7 illustrates a process flow diagram depicting a generalized method for forming a metal film on a substrate in accordance with one or more embodiments of the disclosure. The method 700 generally begins at operation 702, where a substrate upon which a metal film is to be formed is placed into a processing chamber. As used herein, a "substrate surface" refers to any substrate surface upon which a layer may be formed. The substrate surface may have one or more features formed therein, one or more layers formed thereon, and combinations thereof. In one or more embodiments, the substrate (or substrate surface) may be pretreated prior to the deposition of the metal film, for example, by polishing, etching, reduction, oxidation, halogenation, hydroxylation, annealing, baking, or the like.

In one or more embodiments, the substrate may be any substrate capable of having material deposited thereon, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In one or more embodiments, one or more additional layers may be disposed on the substrate such that the metal film may be, at least partially, formed thereon. For example, in one or more embodiments, a layer comprising a metal, a nitride, an oxide, or the like, or combinations thereof may be disposed on the substrate and may have the metal film formed upon such layer or layers.

In one or more embodiments, at operation 703, the substrate is optionally exposed to a blocking compound. This process step is described in more detail below and may be useful for controlling the selectivity of the deposition process on a substrate comprising both a metal surface and a dielectric surface.

In one or more embodiments, at operation 704, a metal film is formed on the substrate. In one or more embodiments, the metal film may be formed via a cyclical deposition process, such as atomic layer deposition (ALD), or the like. In one or more embodiments, the forming of a metal film via a cyclical deposition process may generally comprise exposing the substrate to two or more process gases separately. In time-domain ALD embodiments, exposure to each of the process gases are separated by a time delay/pause to allow the components of the process gases to adhere and/or react on the substrate surface. Alternatively, or in combination, in one or more embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In one or more embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiments of a time-domain ALD or spatial ALD process, the sequence may be repeated until a predetermined layer thickness is formed on the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

In one or more embodiments, the process of forming the metal film at operation 704 may begin by exposing the substrate to a first reactive gas. In one or more embodiments, the first reactive gas comprises a halogen catalyst. In other embodiments, the first reactive gas comprises an alkyl halide catalyst.

As used herein, the term "halide" refers to a binary phase, of which one part is a halogen atom and the other part is an element or radical that is less electronegative than the halogen, to make a fluoride, chloride, bromide, iodide, or astatide compound. A halide ion is a halogen atom bearing a negative charge. As known to those of skill in the art, a halide anion includes fluoride (F—), chloride (Cl—), bromide (Br—), iodide (I—), and astatide (At—).

Unless otherwise indicated, the term "lower alkyl," "alkyl," or "alk" as used herein alone or as part of another group includes both straight and branched chain hydrocarbons, containing 1 to 20 carbons, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents.

In one or more embodiments, the process of forming the metal film at operation 704 begins by exposing the substrate to a first reactive gas comprising an alkyl halide catalyst. In one or more embodiments, the first reactive gas comprises an alkyl halide catalyst and is exposed to the substrate for a first period of time, as shown at operation 706.

In one or more embodiments, the alkyl halide catalyst may be any suitable reactant to adsorb a layer of halogen on the substrate for later reaction. In one or more embodiments, the alkyl halide catalyst comprises carbon and halogen. In one or more embodiments, the halogen comprises bromine or iodine. In one or more embodiments, the halogen is insoluble in the metal film. As used in this regard, a halogen which is insoluble in a metal film comprises less than or equal to about 2%, less than or equal to about 1%, or less than or equal to about 0.5% of the metal film on an atomic basis. In one or more embodiments, the alkyl halide catalyst has the general formula R—X, wherein R is an alkyl, alkenyl, aryl, or other carbonaceous group. In one or more embodiments, R comprises one to two, one to four, or one to six carbon atoms.

In one or more embodiments, the alkyl halide catalyst comprises or consists essentially of iodoethane ($H_5C_2I$) or diiodomethane ($CH_2I_2$). As used in this regard, an alkyl halide catalyst which consists essentially of a stated species comprises greater than 95%, 98%, 99% or 99.5% of the stated species on a molar basis, excluding any inert diluent gases.

In one or more embodiments, the alkyl halide catalyst is delivered to the processing chamber as an alkyl halide catalyst containing gas. In one or more embodiments, the alkyl halide catalyst containing gas may be provided in one or more pulses or continuously. In one or more embodiments, the flow rate of the alkyl halide catalyst containing gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The alkyl halide catalyst containing gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the alkyl halide catalyst containing gas may be any suitable amount of time necessary to allow the alkyl halide catalyst to form an adequate adsorption layer atop the substrate surface(s). For example, the process gas may be flowed into the process chamber for a period of about 0.1 seconds to about 90 seconds. In some time-domain ALD processes, the alkyl halide catalyst containing gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In one or more embodiments, an inert gas may additionally be provided to the process chamber at the same time as the alkyl halide catalyst containing gas. The inert gas may be mixed with the alkyl halide catalyst containing gas (e.g., as a diluent gas) or be provided separately and can be pulsed or of a constant flow. In one or more embodiments, the inert gas is flowed into the processing chamber at a constant flow in the range of about 1 to about 10000 sccm. The inert gas may be any inert gas, for example, such as argon (Ar), helium (He), neon (Ne), or combinations thereof.

The temperature of the substrate during deposition can be controlled, for example, by setting the temperature of the substrate support or susceptor. In one or more embodiments, the substrate is held at a temperature in the range of about 0° C. to about 600° C., or in the range of about 25° C. to about 500° C., or in the range of about 50° C. to about 450° C., or in the range of about 100° C. to about 400° C., or in the range of about 200° C. to about 400° C., or in the range of about 250° C. to about 350° C. In one or more embodiments, the substrate is maintained at a temperature below the decomposition temperature of the metal precursor. In one or more embodiments, the substrate is maintained at a temperature below the decomposition temperature of the alkyl halide catalyst. In one or more embodiments, the substrate is maintained at a temperature between the decomposition temperature of the alkyl halide catalyst and the decomposition temperature of the metal precursor.

In one or more embodiments, the substrate is maintained at a temperature less than or equal to about 400° C., or less than or equal to about 350° C., or less than about 300° C. In one or more embodiments, the substrate is maintained at a temperature greater than or equal to about 250° C., or greater than or equal to about 300° C., or greater than about 350° C. In one or more embodiments, the substrate is maintained at a temperature of about 280° C.

In addition to the foregoing, additional process parameters may be regulated while exposing the substrate to the alkyl halide catalyst containing gas. For example, in one or more embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

Next, at 708, the process chamber (especially in time-domain ALD) may be purged using an inert gas. (This may not be needed in spatial ALD processes as there are gas curtains separating the reactive gases.) The inert gas may be any inert gas, for example, such as argon, helium, neon, or the like. In one or more embodiments, the inert gas may be the same, or alternatively, may be different from the inert gas provided to the process chamber during the exposure of the substrate to the alkyl halide catalyst containing gas at operation 706. In embodiments where the inert gas is the same, the purge may be performed by diverting the first process gas from the process chamber, allowing the inert gas to flow through the process chamber, purging the process chamber of any excess first process gas components or reaction byproducts. In one or more embodiments, the inert gas may be provided at the same flow rate used in conjunction with the first process gas, described above, or in one or more embodiments, the flow rate may be increased or decreased. For example, in one or more embodiments, the inert gas may be provided to the process chamber at a flow rate of about 0 to about 10000 sccm to purge the process chamber. In spatial ALD, purge gas curtains are maintained between the flows of reactive gases and purging the process chamber may not be necessary. In one or more embodiments of a spatial ALD process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases.

Next, at operation 710, the substrate is exposed to a second process gas for a second period of time. The second process gas comprises a precursor which reacts with the adsorbed layer of halogen on the substrate surface to deposit a metal film. In one or more embodiments, the second reactive gas may also be referred to as the precursor gas.

In one or more embodiments, the precursor may be any suitable precursor to react with the adsorbed halogen layer on the substrate. In one or more embodiments, the precursor comprises a metal and at least two ligands. In one or more embodiments, the metal comprises one or more metal atoms.

In one or more embodiments, the metal is selected from one or more of In one or more embodiments, the metal is selected from molybdenum (Mo), ruthenium (Ru), cobalt (Co), copper (Cu), platinum (Pt), nickel (Ni), or tungsten (W). In other embodiments, the metal is selected from ruthenium (Ru), tungsten (W), or molybdenum (Mo). In one or more specific embodiments, the metal comprises ruthenium (Ru).

In one or more embodiments, the precursor comprises multiple, at least two, organic ligands. In one or more embodiments, the precursor comprises a metal, M, and an aromatic ligand $L_1$, and an aliphatic ligand, $L_2$. In one or more specific embodiments, the precursor comprises ruthenium, an aromatic ligand $L_1$, and an aliphatic ligand, $L_2$. In some embodiments, the precursor comprises more than one aliphatic ligand, $L_2$. In one or more embodiments, the precursor comprises from two to eight aliphatic ligands, $L_2$. When more than one aliphatic ligand, $L_2$, is present, the $L_2$ ligands may be the same or different.

In one or more embodiments, the precursor is of the general formula (I): $M\text{-}L_1(L_2)_y$, where M is a metal, $L_1$ is an aromatic ligand, $L_2$ is an aliphatic ligand, and y is a number in the range of from 2 to 8, including from 2 to 6, and from 2 to 5.

In one or more embodiments, the aromatic ligand, $L_1$, comprises a pi electron system selected from $\eta^2$, $\eta^4$, $\eta^6$, and $\eta^8$. In some embodiments, the aromatic ligand, $L_1$, comprises 1-methyl-4-isopropylbenzene.

In one or more embodiments, the aliphatic ligand, $L_2$, comprises an aliphatic diene. In one or more embodiments, the aliphatic ligand, $L_2$, comprises one or more of 1,5-hexadiene, 1,4-hexadiene, 1,3-hexadiene. In one or more embodiments, the aliphatic ligand, $L_2$, comprises less than 5% of 1,3-hexadiene, including less than about 4% of 1,3-hexadiene, less than about 3% 1,3-hexadiene, less than about 2% 1,3-hexadiene, and less than about 1% 1,3-hexadience.

In one or more embodiments, the method comprises forming a film on a substrate surface by exposing the substrate surface to a precursor of general formula (I): $M\text{-}L_1(L_2)_y$, wherein M is a metal, $L_1$ is an aromatic ligand, $L_2$ is an aliphatic ligand, and y is a number in the range of from 2 to 8, wherein $L_2$ comprises 1,5-hexdiene, 1,4-hexadiene, and less than 5% of 1,3-hexadiene.

In one or more embodiments, the precursor comprises a metal, M, and an aromatic ligand $L_1$, and at least two aliphatic ligands, $L_2$. In one or more embodiments, the aliphatic ligand, $L_2$, further comprises an asymmetric cyclic diene. In one or more embodiments, the asymmetric cyclic diene comprises one or more of 3-(2-propenyl)-cyclohexene, 1-(2-propenyl)-cyclohexene, 1,3-propadiene-cyclohexane, and 1,2-divinylcyclohexane.

Without intending to be bound by theory, it is thought that controlling the ratio of hexadiene isomers in a mixture of $L_2$ aliphatic ligands produces a gap fill with superior performance. Thus, in one or more embodiments, the ratio of 1,5-hexadiene to other $L_2$ aliphatic ligands present in the precursor should be greater than 50%. In some embodiments, the ratio of 1,5-hexadiene to other $L_2$ aliphatic ligands present in the precursor is in a range of from about 50:50 to about 60:40. In one or more embodiments, y is a number in a range of from 2 to 6, and the ratio of 1,5-hexadiene to the sum the 1,4-hexadiene, 1,3-hexadiene, and the asymmetric cyclic diene is in a range of from about 50:50 to about 60:40. In one or more embodiments, the asymmetric cyclic diene comprises one or more of 3-(2-propenyl)-cyclohexene, 1-(2-propenyl)-cyclohexene, 1,3-propadiene-cyclohexane, and 1,2-divinylcyclohexane. Accordingly, in one or more embodiments, y is a number in a range of from 2 to 6, and the ratio of 1,5-hexadiene to the sum 1,4-hexadiene, 1,3-hexadiene, 3-(2-propenyl)-cyclohexene, 1-(2-propenyl)-cyclohexene, 1,3-propadiene-cyclohexane, and 1,2-divinylcyclohexane is in a range of from about 50:50 to about 60:40.

In one or more embodiments, the metal of the precursor corresponds to the metal of the deposited metal film. In one or more embodiments, the metal is selected from molybdenum (Mo), ruthenium (Ru), cobalt (Co), copper (Cu), platinum (Pt), nickel (Ni), or tungsten (W). In one or more embodiments, the metal of the precursor has an oxidation state of 0. Stated differently, in one or more embodiments, the metal precursor comprises a zero-valent metal complex.

Additional process parameters may be regulated while exposing the substrate to the precursor gas. For example, in one or more embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr.

In one or more embodiments, the precursor is delivered to the processing chamber as a precursor gas. The precursor gas may be provided in one or more pulses or continuously. The flow rate of the precursor gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The precursor gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

In one or more embodiments, the period of time that the substrate is exposed to the metal precursor gas may be any suitable amount of time necessary to allow the metal precursor to react with the adsorbed halogen on the substrate surface. For example, the process gas may be flowed into the process chamber for a period of about 0.1 seconds to about 90 seconds. In some time-domain ALD processes, the precursor gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In one or more embodiments, an inert gas may additionally be provided to the process chamber at the same time as the precursor gas. The inert gas may be mixed with the precursor gas (e.g., as a diluent gas) or be provided separately and can be pulsed or of a constant flow. In one or more embodiments, the inert gas is flowed into the processing chamber at a constant flow in the range of about 1 to about 10000 sccm. The inert gas may be any inert gas, for example, such as argon, helium, neon, or combinations thereof.

In one or more embodiments, at operation 712, the process chamber may be purged using an inert gas. The inert gas may be any inert gas, for example, such as argon (Ar), helium (He), neon (Ne), or the like. In one or more embodiments, the inert gas may be the same, or alternatively, may be different from the inert gas provided to the process chamber during previous process routines. In embodiments where the inert gas is the same, the purge may be performed by diverting the second process gas from the process chamber, allowing the inert gas to flow through the process chamber, purging the process chamber of any excess second process gas components or reaction byproducts. In one or more embodiments, the inert gas may be provided at the same flow rate used in conjunction with the second process gas, described above, or in one or more embodiments, the flow rate may be increased or decreased. For example, in one or more embodiments, the inert gas may be provided to the process chamber at a flow rate of greater than 0 to about 10,000 sccm to purge the process chamber.

While the generic embodiments of the processing method shown in FIG. 7 includes only two pulses of reactive gases, it will be understood that this is merely exemplary and that additional pulses of reactive gases may be used. In one or more embodiments, the method is performed without the use of an oxygen-containing reactive gas. The sub processes of operation 704 comprise a cycle. A cycle may be performed in any order as long as the reactive gases are separated by a purge of the processing chamber. In one or more embodiments, the metal film is deposited at rate greater than or equal to about 0.2 Å/cycle, greater than or equal to about 0.3 Å/cycle, greater than or equal to about 0.4 Å/cycle, greater than or equal to about 0.5 Å/cycle, greater than or equal to about 0.6 Å/cycle, greater than or equal to about 0.7 Å/cycle, greater than or equal to about 0.8 Å/cycle, greater than or equal to about 0.9 Å/cycle, greater than or equal to about 1.0 Å/cycle, or greater than or equal to about 1.2 Å/cycle.

The deposition process is performed as a thermal process without the use of plasma reactants. Stated differently, in one or more embodiments, the method is performed without plasma.

In one or more embodiments, at decision point 714, it is determined whether the metal film has achieved a predetermined thickness. If the predetermined thickness has not been achieved, the method 700 returns to operation 704 to continue forming the metal film until the predetermined thickness is reached. Once the predetermined thickness has been reached, the method 700 can either end or proceed to operation 716 for optional further processing (e.g., bulk deposition of another metal film). In one or more embodiments, the metal film may be deposited to form a total layer thickness of about 10 Å to about 10,000 Å, or in one or more embodiments, about 10 Å to about 1000 Å, or in one or more embodiments, about 50 Å to about 5,000 Å.

In one or more embodiments, the metal layer comprises greater than or equal to about 75 atomic % ruthenium, or greater than or equal to about 80 atomic % ruthenium, or greater than or equal to about 85 atomic % ruthenium, or greater than or equal to about 90 atomic % ruthenium, or greater than or equal to about 95 atomic % ruthenium.

In one or more embodiments, the metal layer comprises less than or equal to about 10 atomic % oxygen, or less than or equal to about 9 atomic % oxygen, or less than or equal to about 8 atomic % oxygen, or less than or equal to about 7 atomic % oxygen, or less than or equal to about 6 atomic % oxygen, or less than or equal to about 5 atomic % oxygen, or less than or equal to about 4 atomic % oxygen, or less than or equal to about 3 atomic % oxygen.

In one or more embodiments, the metal layer comprises in the range of about 0.02 to about 5 atomic % iodine, or less than or equal to about 1 atomic % iodine.

In one or more embodiments, the metal layer comprises less than or equal to about 20 atomic % carbon, or less than or equal to about 15 atomic % carbon, or less than or equal to about 10 atomic % carbon, or less than or equal to about 5 atomic % carbon.

In one or more embodiments, the metal layer comprises greater than or equal to about 90 atomic % ruthenium, less than or equal to about 3 atomic % oxygen, less than or equal to about 1 atomic % iodine and less than or equal to about 10 atomic % carbon.

In one or more embodiments, the metal layer has a resistivity of less than or equal to about 40 µohm-cm, or less than or equal to about 35 µohm-cm, or less than or equal to about 30 µohm-cm, or less than or equal to about 25 µohm-cm, or less than or equal to about 20 µohm-cm. In One or more embodiments, the metal layer comprises ruthenium and has a resistivity of less than or equal to about 40 µohm-cm, or less than or equal to about 35 µohm-cm, or less than or equal to about 30 µohm-cm, or less than or equal to about 25 µohm-cm, or less than or equal to about 20 µohm-cm.

In one or more embodiments, the metal film is further processed by annealing the metal film. Without intending to be bound by theory, it is believed that annealing the film at a high temperature under an argon (Ar) or hydrogen ($H_2$) atmosphere reduces carbon and halogen impurities in the metal film. In one or more embodiments, the metal film is annealed under an atmosphere comprising argon or hydrogen gas ($H_2$) to reduce the atomic concentration of carbon and/or halogen impurities.

The metal film deposited by one or more embodiments is smoother than the films deposited by known oxygen-based deposition processes. In one or more embodiments, the metal film has a surface roughness of less than or equal to about 10%, less than or equal to about 8%, less than or equal to about 5%, or less than or equal to about 2%, of a thickness of the metal film.

The purity of the metal film is high. In one or more embodiments, the metal film has a carbon content less than or equal to about 2%, less than or equal to about 1%, or less than or equal to about 0.5% carbon on an atomic basis. In one or more embodiments, the metal film has a halogen content less than or equal to about 1% or less than or equal to about 0.5% halogen on an atomic basis. In one or more embodiments, the metal film has a purity of greater than or equal to about 95%, greater than or equal to about 97%, greater than or equal to about 99%, greater than or equal to about 99.5%, or greater than or equal to about 99.9% metal atoms on an atomic basis.

One or more embodiments of the disclosure selectively deposit a first metal film on a second metal surface over a first dielectric surface. These methods are similar to method 700 as described above, except that the substrate provided comprises a first dielectric surface and a second metal surface. The first metal (of the metal film) and the second metal (of the substrate surface) may be the same metal or may be different metals. In one or more embodiments, the first metal is molybdenum (Mo), ruthenium (Ru), cobalt (Co), copper (Cu), platinum (Pt), nickel (Ni), or tungsten (W), while the second metal is tungsten (W), cobalt (Co), or copper (Cu).

In one or more embodiments, the first dielectric surface may be formed from any suitable dielectric material. In one or more embodiments, the dielectric material comprises nitrogen or oxygen atoms. Without being bound by theory, it is believed that these materials react with the alkyl halide catalyst and prevents the halogen from adsorbing onto the substrate surface so as to catalyze the reaction with the metal precursor. Accordingly, little, if any, metal film is formed on the dielectric surface.

In one or more embodiments, the deposition temperature is below the decomposition temperature of the alkyl halide catalyst. Again, without being bound by theory, it is believed that if the alkyl halide catalyst decomposes, the halogen will be available for reaction with the metal precursor on all surfaces (regardless of composition), leading to metal film deposition on all substrate surfaces, including the dielectric surface. In one or more embodiments, the deposition temperature is at or above the decomposition temperature of the alkyl halide catalyst.

One or more embodiments of the disclosure selectively deposit a first metal film on a first dielectric surface over a second metal surface. These methods are similar to method 700 as described above, except that the substrate provided comprises a first dielectric surface and a second metal surface and the substrate is exposed to a blocking compound at operation 703.

In one or more embodiments, at operation 703, a substrate comprising at least a second metal surface and a first dielectric surface is exposed to a blocking compound. The blocking compound may be any suitable compound for blocking deposition on the second metal surface. In one or more embodiments, the blocking compound comprises at least one triple bond between two carbon atoms. Stated differently, in one or more embodiments, the blocking compound comprises an alkyne. In one or more embodiments, the blocking compound has the general formula of R'≡R". In one or more embodiments, R' and R" are identical. In one or more embodiments, R' and/or R" are an alkyl or other carbonaceous group. In one or more embodiments, the blocking compound comprises 4-12 carbon atoms. In one or more embodiments, R' and/or R" are linear. In One or more embodiments, R' and/or R" are branched. In one or more embodiments, the blocking compound comprises 3-hexyne.

The first metal (of the metal film) and the second metal (of the substrate surface) may be the same metal or may be different metals. In one or more embodiments, the first metal is molybdenum (Mo), ruthenium (Ru), cobalt (Co), copper (Cu), platinum (Pt), nickel (Ni), or tungsten (W), while the second metal is tungsten (W), cobalt (Co), or copper (Cu)

The first dielectric surface may be formed from any suitable dielectric material. In one or more embodiments, the dielectric material comprises nitrogen or oxygen atoms.

As mentioned previously, in one or more embodiments, the deposition temperature is at or above the decomposition temperature of the alkyl halide catalyst. In one or more embodiments, the deposition temperature is greater than or equal to about 250° C., greater than or equal to about 260° C., greater than or equal to about 270° C., greater than or equal to about 280° C., greater than or equal to about 290° C., or greater than or equal to about 300° C. In one or more embodiments, the deposition temperature is in the range of about 250° C. to about 450° C., or in the range of about 300° C. to about 400° C. In one or more embodiments, the deposition temperature is about 350° C.

As stated previously, without being bound by theory, it is believed that these materials react with the alkyl halide catalyst and prevent the halogen from adsorbing onto the substrate surface so as to catalyze the reaction with the metal precursor. Accordingly, little, if any, metal film is formed on the dielectric surface.

In one or more embodiments, however, when the deposition temperature is above the decomposition temperature of the alkyl halide catalyst, the halogen atoms are deposited on the entire substrate surface, thereby allowing deposition on the dielectric surface. In one or more embodiments, the metal surface is blocked by the blocking compound, so as to allow little, if any, metal film to be formed on the metal surface. Accordingly, deposition of the metal film is selective to the dielectric surface over the metal surface, In general terms, according to one or more embodiments, the deposition of highly pure metal films can be understood as follows. A substrate, maintained at a deposition temperature, is exposed to an alkyl halide catalyst (R—X) to adsorb R and X on the substrate, where R is a carbonaceous group and X is a halogen. In one or more embodiments, X is a halogen selected from one or more of fluorine (F), chlorine (Cl), bromine (Br), iodine (I), and astatine (At). R is desorbed in the form of R—R or R$^-$, leaving X adsorbed on the substrate. The substrate is exposed to a precursor, M-L$_1$(L$_2$)$_y$, where M is the metal and L$_1$ is an aromatic ligand, L$_2$ is an aliphatic ligand, and y is a number in the range of from 2 to 8, including from 2 to 6, and from 2 to 5. In one or more embodiments, L$_2$ comprises 1,5-hexdiene, 1,4-hexadiene, and less than 5% of 1,3-hexadiene. In other embodiments, the aliphatic ligand, L$_2$, further comprises an asymmetric cyclic diene. In some embodiments, the asymmetric cyclic diene comprises one or more of 3-(2-propenyl)-cyclohexene, 1-(2-propenyl)-cyclohexene, 1,3-propadiene-cyclohexane, and 1,2-divinylcyclohexane.

In one or more embodiments, M-L$_1$(L$_2$)$_y$ reacts with the adsorbed X to form M-X on the substrate surface, liberating L$_1$(L$_2$)$_y$. M-X reacts with other M-X moieties on the substrate to form M-M. This reaction may produce either X-X or X. X-X may be desorbed and purged. X$^-$ may remain on the surface to further react with M-L$_1$(L$_2$)$_y$.

In one or more embodiments, this general mechanism relies on several premises. First, X is not soluble in M. Without intending to be bound by theory, the insolubility of X confers that X will not be found in appreciable quantity within the final metal film. While it is possible to ignore this premise (e.g., utilizing a halogen soluble in M), using a halogen (X) which is soluble in M is believed to provide metal films with lower purity. Second, in terms of bond strength, M-L$_1$(L$_2$)$_y$ is weaker than M-X which is weaker than M-M. Again, without intending to be bound by theory, these thermodynamic relationships ensure that the reactions identified above are thermodynamically favorable. Finally, $M-L_1(L_2)_y$ is thermally stable at the deposition temperature. Stated differently, the thermal decomposition temperature of the metal precursor is higher than the deposition temperature. The theory here states that if the metal precursor decomposes, the deposited film will contain an appreciable quantity of the precursor ligands $L_1$ and $(L_2)_y$, typically seen as carbon impurities.

In one or more embodiments, it has been surprisingly found that processes including precursors of general formula (I) $M-L_1(L_2)_y$, alkyl halide catalysts and process conditions which meet all of the above requirements deposit highly pure metal films and are particularly suitable for seamless gap fill processes.

Additionally, it was surprisingly found that if the deposition temperature is below the thermal decomposition temperature of the halogen catalyst, e.g. alkyl halide catalyst, the deposition process is selective to metal surfaces over dielectric surfaces without requiring the use of a blocking layer.

Further, it was surprisingly found that if the deposition temperature is at or above the thermal decomposition temperature of the halogen catalyst, e.g. alkyl halide catalyst, the deposition process can be made selective by exposing the metal surface to a small alkyne blocking compound.

One or more embodiments of the disclosure advantageously provide methods of depositing conformal metal films on substrates comprising high aspect ratio structures. As used in this regard, the term "conformal" means that the thickness of the metal film is uniform across the substrate surface. As used in this specification and the appended claims, the term "substantially conformal" means that the thickness of the metal film does not vary by more than about 10%, 5%, 2%, 1%, or 0.5% relative to the average thickness of the film. Stated differently a film which is substantially conformal has a conformality of greater than about 90%, 95%, 98%, 99% or 99.5%.

One or more embodiments of the disclosure are directed to memory devices comprising a ruthenium conductive layer. In one or more embodiments, the ruthenium conductive layer comprises greater than or equal to about 90 at. % ruthenium, less than or equal to about 3 at. % oxygen, less than or equal to about 1 at. % iodine and less than or equal to about 10 at. % carbon, and a resistivity less than or equal to about 40 µohm-cm.

In one or more embodiments, the ruthenium conductive layer is formed on a barrier layer. The barrier layer of one or more embodiments has a thickness less than or equal to about 10 Å, 20 Å, 30 Å, 40 Å or 50 Å. In one or more embodiments, the ruthenium conductive layer is formed on a substrate without an intervening barrier layer.

The above disclosure relates to the deposition of metal films by a sequential pulse of reactants. The following disclosure relates to the deposition of metal films by a simultaneous or constant-flow process. In one or more embodiments, the sequential pulse methods are ALD methods. In one or more embodiments, the simultaneous or constant-flow methods are CVD methods. While the process steps differ, many of the reactants and process parameters are similar.

Figure 8:
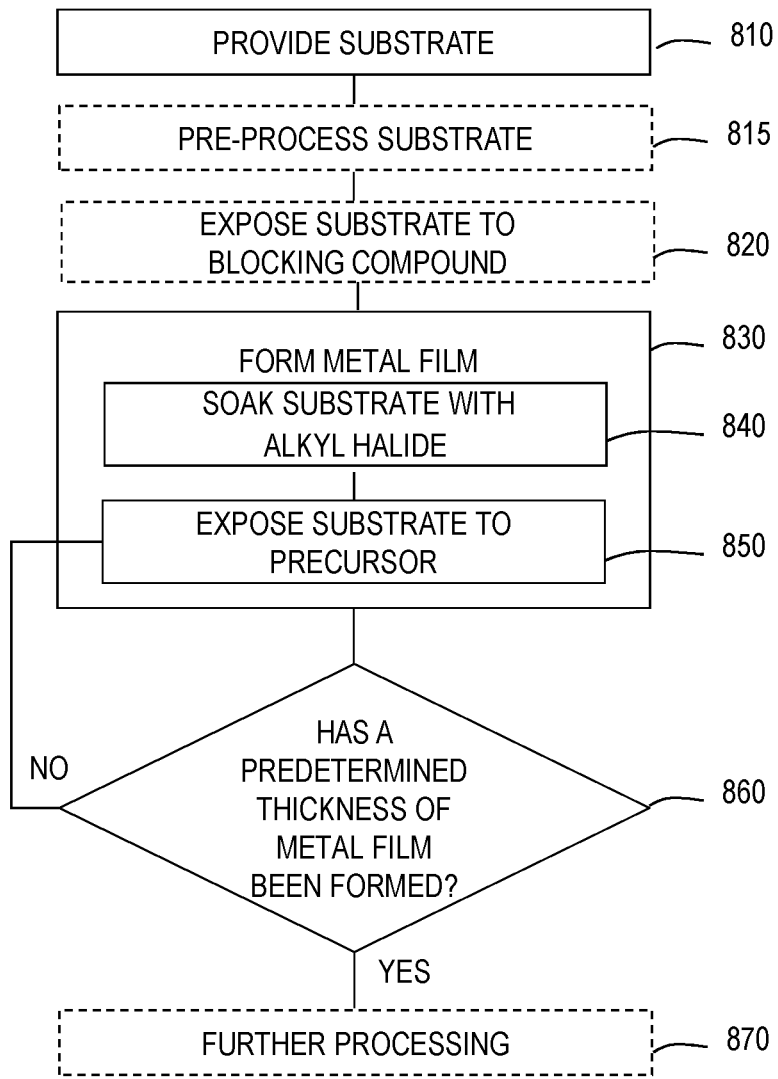
FIG. 8 illustrates a process flow diagram of a process sequence for the formation of a ruthenium layer according to one or more embodiments of the disclosure.
Figure 9:
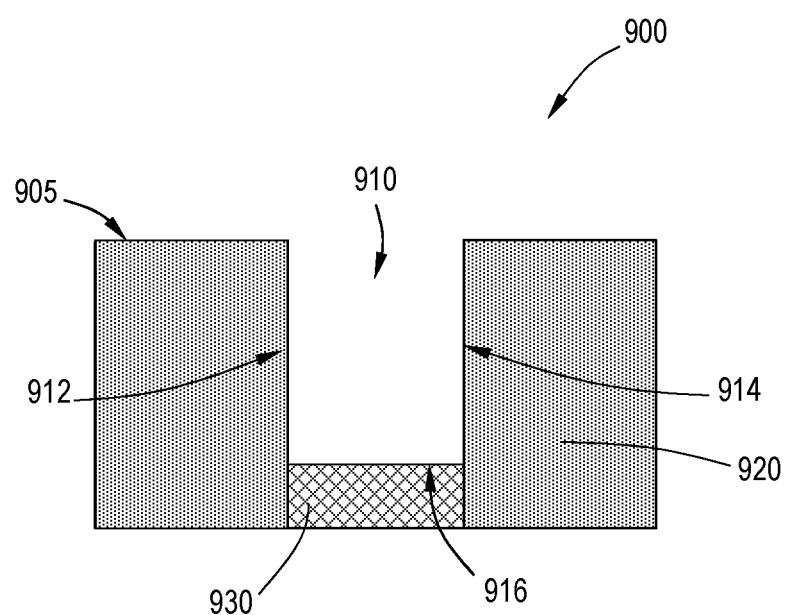
FIG. 9 illustrates a cross-sectional view of an exemplary substrate in accordance with one or more embodiments of the disclosure.

FIG. 8 illustrates a process flow diagram depicting a generalized method 800 for forming a metal film on a substrate in accordance with one or more embodiments of the disclosure. FIG. 9 illustrates an exemplary substrate for processing in accordance with one or more embodiments of the disclosure. The method 800 generally begins at operation 810, where a substrate 900 upon which a metal film is to be formed is placed into a processing chamber.

Referring to FIG. 9, an exemplary substrate 900 is shown. In one or more embodiments, the substrate 900 has a substrate surface 905 with at least one feature 910 therein. The feature 910 has a sidewall 912, 914 and a bottom 916. In one or more embodiments, a dielectric material 920 forms the sidewall 912, 914 and a metallic material 930 forms the bottom 916.

In one or more embodiments, the substrate 900 may undergo pre-processing steps. At 815, the substrate may optionally have one or more layers formed on the substrate surface.

In one or more embodiments, a metal nitride liner is deposited in the feature 910. In one or more embodiments, the metal nitride liner comprises titanium nitride. In one or more embodiments, the metal nitride liner has a thickness in a range of about 15 Å to about 40 Å. In one or more embodiments, the metal nitride liner has a thickness of about 20 Å or about 30 Å.

In one or more embodiments, a seed layer is deposited on the substrate surface. In one or more embodiments, the seed layer is a conformal layer. In one or more embodiments, the seed layer is continuous. In one or more embodiments, the thickness of the seed layer is in a range of about 1 nm to about 5 nm, or in a range of about 1 nm to about 4 nm. In one or more embodiments, the seed layer comprises a ruthenium layer deposited by a known atomic layer deposition method. In one or more embodiments, the seed layer is deposited by an ALD cycle comprising a precursor exposure and an alkyl halide catalyst exposure with intervening purges. In one or more embodiments, the seed layer is deposited by an ALD cycle comprising a precursor exposure and an ammonia plasma exposure with intervening purges.

In one or more embodiments, the precursor is of general formula (I): $M-L_1(L_2)_y$, where M is a metal and $L_1$ is an aromatic ligand, $L_2$ is an aliphatic ligand, and y is a number in the range of from 2 to 8, including from 2 to 6, and from 2 to 5. In one or more embodiments, the aliphatic ligand, $L_2$, comprises an aliphatic diene. In one or more embodiments, the aliphatic ligand, $L_2$, comprises one or more of 1,5-hexadiene, 1,4-hexadiene, 1,3-hexadiene. In one or more embodiments, the aliphatic ligand, $L_2$, comprises less than 5% of 1,3-hexadiene, including less than about 4% of 1,3-hexadiene, less than about 3% 1,3-hexadiene, less than about 2% 1,3-hexadiene, and less than about 1% 1,3-hexadience. In one or more embodiments, the precursor comprises a metal, M, and an aromatic ligand $L_1$, and at least two aliphatic ligands, $L_2$. In one or more embodiments, the aliphatic ligand, $L_2$, further comprises an asymmetric cyclic diene. In one or more embodiments, the asymmetric cyclic diene comprises one or more of 3-(2-propenyl)-cyclohexene, 1-(2-propenyl)-cyclohexene, 1,3-propadiene-cyclohexane, and 1,2-divinylcyclohexane.

In one or more embodiments, at operation 820, the substrate is optionally exposed to a blocking compound. This process step is described in more detail below and may be useful for controlling the selectivity of the deposition process on a substrate comprising both a metal surface and a dielectric surface.

In one or more embodiments, at 830, a metal film is formed on the substrate. The process of forming the metal film at operation 830 may begin by soaking the substrate with a catalytic gas. In one or more embodiments, the catalytic gas comprises an alkyl halide catalyst and is exposed to the substrate for a first period of time, as shown at operation 840.

In one or more embodiments, the halogen catalyst, e.g. alkyl halide catalyst, may be any suitable reactant to adsorb a layer on the substrate for later reaction. Stated differently, soaking the substrate in the halogen catalyst, e.g. alkyl halide catalyst, forms an activated substrate surface. The halogen catalyst, e.g. alkyl halide catalyst, is described above and elsewhere herein.

In one or more embodiments, the halogen catalyst, e.g. alkyl halide catalyst may be provided to the processing chamber in one or more pulses or continuously. In one or more embodiments, the halogen catalyst, e.g. alkyl halide catalyst, is provided with an inert carrier gas and is referred to the alkyl halide catalyst containing gas. The flow rate and pressure of the halogen catalyst, e.g. alkyl halide catalyst, or halogen catalyst, e.g. alkyl halide catalyst, containing gas can be any suitable values. Exemplary flow rates and pressures disclosed elsewhere herein for the halogen catalyst, e.g. alkyl halide catalyst, containing gas are also applicable in this embodiment.

In one or more embodiments, the period of time that the substrate is soaked in the halogen catalyst, e.g. alkyl halide catalyst, may be any suitable amount of time necessary to allow the halogen catalyst to form an adequate adsorption layer on the substrate surface(s). For example, the halogen catalyst may be allowed to soak the substrate for a period of greater than about 3 seconds or greater than about 5 seconds. In one or more embodiments, the soak period is in a range of about 3 seconds to about 60 seconds.

In one or more embodiments, an inert gas may additionally be provided to the process chamber at the same time as the halogen catalyst, e.g. alkyl halide catalyst, containing gas. The inert gas may be mixed with the halogen catalyst (e.g., as a diluent gas) or be provided separately and can be pulsed or of a constant flow. The inert gas may be any inert gas, for example, such as argon, helium, neon, or combinations thereof.

In one or more embodiments, at operation 850, the substrate is exposed to a second process gas for a second period of time. The second process gas comprises a metal precursor which reacts with the adsorbed layer of alkyl halide catalyst or halogen on the substrate surface to deposit a metal film. The second reactive gas may also be referred to as the metal precursor gas.

In one or more embodiments, the metal precursor may be any suitable precursor to react with the adsorbed alkyl halide catalyst layer or halogen layer on the substrate. Suitable metal precursors are described elsewhere herein.

In one or more embodiments, the metal precursor is delivered to the processing chamber as a metal precursor gas. The metal precursor gas may be provided in one or more pulses or continuously. The flow rate and pressure of the metal precursor gas can be any suitable flow rate and pressure. Exemplary values for flow rate and pressure are discussed elsewhere herein.

In one or more embodiments, the period of time that the substrate is exposed to the metal precursor gas may be any suitable amount of time necessary to allow the metal precursor to react with the adsorbed halogen on the substrate surface. For example, the process gas may be flowed into the process chamber for a period of greater than or equal to about 60 seconds. In one or more embodiments, the period of exposure to the metal precursor is about 100 seconds, about 200 seconds, about 300 seconds, about 400 seconds or about 500 seconds.

The temperature of the substrate during exposure to the metal precursor can be controlled, for example, by setting the temperature of the substrate support or susceptor. This temperature is also referred to as the deposition temperature. In one or more embodiments, the substrate is maintained at a temperature below the decomposition temperature of the metal precursor. In one or more embodiments, the substrate is maintained at a temperature below the decomposition temperature of the alkyl halide catalyst. In one or more embodiments, the substrate is maintained at a temperature between the decomposition temperature of the alkyl halide catalyst and the decomposition temperature of the metal precursor.

In one or more embodiments, the substrate is maintained at a temperature less than or equal to about 400° C., or less than or equal to about 350° C., or less than or equal to about 300° C., or less than or equal to about 250° C., or less than or equal to about 200° C. In one or more embodiments, the substrate is maintained at a temperature greater than or equal to about 150° C., or greater than or equal to about 200° C., or greater than or equal to about 250° C., or greater than or equal to about 300° C., or greater than or equal to about 350° C. In one or more embodiments, the substrate is maintained at a temperature of about 225° C. or about 280° C.

In one or more embodiments, the deposition process is performed as a thermal process without the use of plasma reactants. Stated differently, in one or more embodiments, the method is performed without plasma.

In one or more embodiments, at operation 860, it is determined whether the metal film has achieved a predetermined thickness. If the predetermined thickness has not been achieved, the method 800 returns to 850 to continue exposing the substrate to the metal precursor until the predetermined thickness is reached. Once the predetermined thickness has been reached, the method 800 can either end or proceed to 870 for optional further processing. In one or more embodiments, the metal film may be deposited to form a total layer thickness of about 10 Å to about 10,000 Å, or in one or more embodiments, about 20 Å to about 1000 Å, or in one or more embodiments, about 50 Å to about 200 Å.

One or more embodiments of the disclosure selectively deposit a metal film on a metal surface over a first dielectric surface. These methods are similar to method 800 as described above. The substrate provided comprises a dielectric surface and a metal surface. In one or more embodiments, a substrate as illustrated in FIG. 9 is processed to selectively form bottom up gap fill on the metal surface at the bottom 916 of the feature 910.

The metal of the metal film and the metal of the substrate surface may be the same metal or may be different metals. The dielectric surface may be formed from any suitable dielectric material. In one or more embodiments, the dielectric material comprises nitrogen or oxygen atoms. Without being bound by theory, it is believed that these materials react with the alkyl halide catalyst and prevent the halogen from adsorbing onto the substrate surface so as to catalyze the reaction with the metal precursor. Accordingly, little, if any, metal film is formed on the dielectric surface.

In one or more embodiments, the deposition temperature is below the decomposition temperature of the halogen catalyst, e.g. alkyl halide catalyst. Again, without intending to be bound by theory, it is believed that if the alkyl halide catalyst decomposes, the halogen will be available for reaction with the metal precursor on all surfaces (regardless of composition), leading to metal film deposition on all substrate surfaces, including the dielectric surface. In one or more embodiments, the deposition temperature is at or above the decomposition temperature of the halogen catalyst, e.g. alkyl halide catalyst.

One or more embodiments of this disclosure advantageously provide methods for controlling the deposition of a metal film. In one or more embodiments, the rate of deposition is controlled. In one or more embodiments, the location of deposition is controlled.

The methods of various embodiments use methods of atomic layer deposition (ALD) or chemical vapor deposition (CVD) to form the metal films. The above disclosure describes an exemplary ALD process with respect to FIG. 7 and an exemplary CVD process with respect to FIG. 8.

As stated previously, the generalized deposition processes shown in FIGS. 7 and 8 are performed as thermal processes without the use of plasma reactants. The use and effect of plasmas and other additional reactants is discussed further below.

One or more embodiments of the disclosure advantageously provide methods of depositing metal films within substrate features or other structures. Exemplary features or structures include, but are not limited to, trenches and vias.

One or more embodiments of the disclosure advantageously provide deposition control methods for reducing film deposition outside of a target feature and near the feature opening. Without being bound by theory, it is believed that reducing deposition in these areas allows faster gap fill within the target feature and reduces clogging near the feature opening and formation of voids or seams within the feature.

Referring to FIGS. 7 and 8, without limiting the scope of the above disclosure, both the ALD and CVD processes described above utilize an alkyl halide catalyst and a metal precursor to deposit a metal film. Without being bound by theory, it is believed that the alkyl halide catalyst functions as a catalyst in the deposition of the metal film. Accordingly, as particularly evidenced by the CVD process, a single exposure of the substrate surface to an alkyl halide catalyst can be used to deposit a thickness of more than 10 nm of metal film.

One or more embodiments of the disclosure advantageously provide deposition control methods for reducing the activity of the catalyst in predetermined areas of the substrate surface. In one or more embodiments, the activity of catalyst is reduced. In one or more embodiments, the activity of the catalyst is eliminated.

Referring to FIGS. 10A-10D, an exemplary substrate 400 is shown during processing according to one or more embodiments of this disclosure. The substrate 1000 illustrated in FIGS. 10A-10D is simplified for explanation. As mentioned above, and shown in FIG. 9, in one or more embodiments, the substrates of this disclosure contain features or structures not depicted in FIGS. 10A-10D.

In FIG. 10A, the substrate 1000 contains a substrate surface 1010. In FIG. 4B, the substrate surface 1010 is exposed to a halogen catalyst, e.g. alkyl halide catalyst, to form an activated surface 1020. As described above, the halogen catalyst, e.g. alkyl halide catalyst, 1040 adsorbs to the substrate surface 1010 to form an activated substrate surface 1020.

In FIG. 10C, a predetermined area of the activated surface 1020 is exposed to a deactivation treatment to form a deactivated surface 1030. The halogen catalyst, e.g. alkyl halide catalyst, 1040 shown in FIGS. 10B and 10C is shown as circular or ovoid, however no specific molecular shape is intended to be conveyed. Similarly, the difference between the circular shapes shown in FIGS. 10B and 10C and the ovoid shapes shown in FIG. 10C is meant only to convey the activity and/or relative concentration of alkyl halide catalyst on the substrate surfaces.

In FIG. 10D, the substrate 1000 is exposed to a metal precursor to form a metal film 1050. As shown in FIG. 10D, the thickness $T_1$ of the metal film 1050 on the activated surface 1020 is greater than the thickness $T_2$ of the metal film 1050 on the deactivated surface 1030.

In one or more embodiments, the deactivation treatment reduces the concentration of the halogen catalyst, e.g. alkyl halide catalyst, on the activated surface 1020. In one or more embodiments, the deactivation treatment reduces the catalytic activity of the halogen catalyst, e.g. alkyl halide catalyst, on the activated surface 1020.

In one or more embodiments, the method described above with respect to FIGS. 10A-10D is modified to include the deactivation treatment before exposure to the halogen catalyst, e.g. alkyl halide catalyst. In this regard, the deactivation treatment may be understood to "superactivate" a predetermined area of the substrate surface 1010 before exposure to the halogen catalyst, e.g. alkyl halide catalyst. Upon exposure to the halogen catalyst, e.g. alkyl halide catalyst, the "superactivated" surface forms a higher concentration or activity of catalyst than a surface not exposed to the deactivation treatment. The difference in concentration and/or activity between the surfaces may be used to control deposition. In one or more embodiments, the surfaces may be further deactivated as described above with respect to FIGS. 10C-10D.

The thickness $T_1$ is greater than the thickness $T_2$. Accordingly, one or more embodiments of the disclosure advantageously provide deposition control methods for controlling the amount of deposition in predetermined areas of the substrate surface.

In one or more embodiments, the ratio of $T_1:T_2$ is greater than or equal to about 1:1, greater than or equal to about 2:1, greater than or equal to about 3:1, greater than or equal to about 4:1, greater than or equal to about 5:1, or greater than or equal to about 10:1. In one or more embodiments, little to no deposition of metal occurs on the deactivated surface 1030. Stated differently, in one or more embodiments, thickness $T_2$ is about 0. Stated differently, the amount of metal film 1050 deposited on the deactivated surface 1030 is essentially none. As used in this regard, "essentially none" means that the metal film on the deactivated surface covers less than 5%, less than 2%, less than 1% or less than 0.5% of the deactivated surface.

The thicknesses of the metal film 1050 deposited on the activated surface 1020 and the deactivated surface 1030 is directly proportional to the rates of deposition on the activated surface 1020 and the deactivated surface 1030. Accordingly, one or more embodiments of the disclosure advantageously provide deposition control methods for controlling the rate of deposition in predetermined areas of the substrate surface.

In one or more embodiments, the entire substrate surface is exposed to the deactivation treatment. One or more embodiments of the disclosure may be used to control the amount of deposition on the entire substrate. One or more embodiments of the disclosure may be used to control the rate of deposition on the entire substrate.

In one or more embodiments, not shown, the substrate 1000 comprises one or more features. In one or more embodiments, the deactivated surface 1030 is the surface outside of the one or more feature. In one or more embodiments, the deactivated surface 1030 is the surface near the top of the sidewall of the one or more feature.

Without being bound by theory, it is believed that the surface near substrate features and the top surfaces of the sidewalls of those features are more highly activated (exhibits greater deposition) due to multiple exposed faces within close proximity. The greater deposition on these surfaces increases the likelihood that the feature will close before a sufficient amount of film is formed inside of the feature. When features close a seam or void is often formed. Accordingly, in one or more embodiments, the deactivated surface 1030 is the surface near the top of the one or more feature. Further, in one or more embodiments, the deactivated surface 1030 is the surface near the substrate feature. In one or more embodiments, the metal film deposited within the feature has reduced seams or voids. In one or more embodiments, the metal film deposited within the feature has substantially no seam or voids. As used in this regard, the term "substantially no seam" means that any gap formed in the film between the sidewalls is less than about 1% of the cross-sectional area of the sidewall.

In one or more embodiments, the predetermined areas of the substrate are exposed to hydrogen gas without the use of plasma.

In one or more embodiments, a hydrogen gas pulse is introduced into the ALD deposition cycle described above. Stated differently, a substrate may be exposed to a pulse sequence of alkyl halide catalyst, purge, hydrogen gas, purge, metal precursor, purge. In one or more embodiments, the substrate is exposed to an additional pulse of hydrogen gas followed by a purge after exposure to the metal precursor. In one or more embodiments, the substrate is exposed to an additional pulse of hydrogen gas followed by a purge after exposure to the alkyl halide catalyst. In one or more embodiments, the purge phase between each exposure to the metal precursor and/or the alkyl halide catalyst is performed in some, but not all cycles.

In one or more embodiments a hydrogen gas exposure is introduced into the CVD deposition cycle described above. Stated differently, a substrate may be soaked with the alkyl halide catalyst, exposed to hydrogen gas and exposed to the metal precursor. In one or more embodiments, the substrate is exposed to the hydrogen gas before exposure to the metal precursor. In one or more embodiments, the hydrogen gas and the metal precursor are flowed simultaneously.

In one or more embodiments, the predetermined areas of the substrate are exposed to a plasma comprising one or more of hydrogen ($H_2$), ammonia ($NH_3$) or argon (Ar). In one or more embodiments, the plasma used to deactivate the surface is a low powered plasma. In One or more embodiments, the plasma has a power in a range of about 50 W to about 500 W, in a range of about 50 W to about 300 W, in a range of about 50 W to about 200 W, or in a range of about 50 W to about 100 W.

In one or more embodiments, the plasma exposure time is less than or equal to about 30 seconds, less than or equal to about 20 seconds, less than or equal to about 15 seconds, less than or equal to about 10 seconds, less than or equal to about 5 seconds, or less than or equal to about 2 seconds.

In one or more embodiments, the plasma is a conductively coupled plasma (CCP). In one or more embodiments, the plasma is an inductively coupled plasma (ICP). In one or more embodiments, the plasma is a direct plasma generated within the processing environment. In one or more embodiments, the plasma is a remote plasma generated outside of the processing environment.

In one or more embodiments, a plasma pulse is introduced into the ALD deposition cycle described above. In one or more embodiments, the plasma pulse replaces the hydrogen gas pulse described above with respect to the ALD deposition cycle.

In one or more embodiments, a plasma pulse is introduced into the CVD deposition cycle described above. In one or more embodiments, the plasma pulse replaces the hydrogen gas exposure described above with respect to the CVD deposition cycle.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiments," "certain embodiments," "one or more embodiments" or "an embodiment" means that a particular feature, structure, material, or characteristic described in connection with the embodiments is included in at least one embodiments of the disclosure. Thus, the appearances of the phrases such as "in one or more embodiments," "in certain embodiments," "in one embodiments" or "in an embodiment" in various places throughout this specification are not necessarily referring to the same embodiments of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a film, the method comprising:
   forming a film on a substrate surface by exposing the substrate surface to a precursor of general formula (I): $M\text{-}L_1(L_2)_y$, wherein M is a metal, $L_1$ is an aromatic ligand, $L_2$ is an aliphatic ligand, and y is a number in the range of from 2 to 8, wherein $L_2$ comprises 1,5-hexadiene, 1,4-hexadiene, and less than 5% of 1,3-hexadiene.

2. The method of claim 1, wherein the metal M is selected from one or more of molybdenum (Mo), ruthenium (Ru), cobalt (Co), copper (Cu), platinum (Pt), nickel (Ni), or tungsten (W).

3. The method of claim 1, further comprising, prior to forming the film, forming an activated substrate surface by exposing the substrate surface to a halogen catalyst.

4. The method of claim 1, wherein the substrate surface has at least one feature formed therein, the at least one feature having a sidewall and a bottom.

5. The method of claim 1, wherein the aromatic ligand, $L_1$, comprises a pi electron system selected from $\eta^2$, $\eta^4$, $\eta^6$, and $\eta^8$.

6. The method of claim 5, wherein the aromatic ligand, $L_1$, comprises 1-methyl-4-isopropylbenzene.

7. The method of claim 1, wherein the aliphatic ligand, $L_2$, further comprises an asymmetric cyclic diene.

8. The method of claim 7, wherein the asymmetric cyclic diene comprises one or more of 3-(2-propenyl)-cyclohexene, 1-(2-propenyl)-cyclohexene, 1,3-propadiene-cyclohexane, and 1,2-divinylcyclohexane.

9. The method of claim 7, wherein y is a number in a range of from 2 to 6, and wherein the ratio of 1,5-hexadiene to the sum the 1,4-hexadiene, 1,3-hexadiene, and the asymmetric cyclic diene is in a range of from about 50:50 to about 60:40.

10. The method of claim 4, wherein a surface of a dielectric material forms the sidewall and a surface of a metallic material forms the bottom.

11. The method of claim 10, further comprising depositing a metal nitride liner in the at least one feature.

12. The method of claim 3, further comprising depositing a seed layer on the substrate surface before exposing the substrate surface to the halogen catalyst.

13. The method of claim 1, wherein exposing the substrate surface to the halogen catalyst comprises soaking a substrate in an alkyl halide catalyst.

14. The method of claim 13, wherein the alkyl halide catalyst comprises iodoethane or diiodomethane.

15. A method of depositing a film, the method comprising:
exposing a substrate surface to a halogen catalyst to form an activated substrate surface; and
exposing the activated substrate surface to a precursor of general formula (I): $M\text{-}L_1(L_2)_y$, wherein M is a metal, $L_1$ is an aromatic ligand, $L_2$ is an aliphatic ligand, and y is a number in the range of from 2 to 8 to form a metal film on the substrate surface, wherein the $L_2$ comprises 1,5-hexdiene, 1,4-hexadiene, and less than 5% of 1,3-hexadiene.

16. The method of claim 15, wherein the aromatic ligand, $L_1$, comprises a pi electron system selected from $\eta^2$, $\eta^4$, $\eta^6$, and $\eta^8$.

17. The method of claim 15, wherein the substrate surface has at least one feature formed therein, the at least one feature having a sidewall and a bottom.

18. The method of claim 17, further comprising depositing a metal nitride liner in the at least one feature.

19. The method of claim 15, wherein exposing the substrate surface to the halogen catalyst comprises soaking a substrate in an alkyl halide catalyst.

20. A non-transitory computer readable medium including instructions, that, when executed by a controller of a processing chamber, causes the processing chamber to perform operations of:
exposing a substrate surface to a halogen catalyst to form an activated substrate surface; and
flowing a precursor into a processing volume of the processing chamber having the substrate, the precursor having general formula (I): $M\text{-}L_1(L_2)_y$, wherein M is a metal, $L_1$ is an aromatic ligand, $L_2$ is an aliphatic ligand, and y is a number in the range of from 2 to 8, wherein the $L_2$ comprises 1,5-hexdiene, 1,4-hexadiene, and less than 5% of 1,3-hexadiene.

* * * * *